(12) United States Patent
Shue et al.

(10) Patent No.: US 9,521,263 B2
(45) Date of Patent: Dec. 13, 2016

(54) LONG TERM MONITORING OF TRANSMISSION AND VOICE ACTIVITY PATTERNS FOR REGULATING GAIN CONTROL

(71) Applicant: DOLBY LABORATORIES LICENSING CORPORATION, San Francisco, CA (US)

(72) Inventors: Yen-Liang Shue, Kensington (AU); David Gunawan, Baulkham Hills (AU); Glenn N. Dickins, Como (AU)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 0 days.

(21) Appl. No.: 14/419,924

(22) PCT Filed: Sep. 9, 2013

(86) PCT No.: PCT/US2013/057835
§ 371 (c)(1),
(2) Date: Feb. 5, 2015

(87) PCT Pub. No.: WO2014/043024
PCT Pub. Date: Mar. 20, 2014

(65) Prior Publication Data
US 2015/0215467 A1 Jul. 30, 2015

Related U.S. Application Data

(60) Provisional application No. 61/701,861, filed on Sep. 17, 2012.

(51) Int. Cl.
*H04M 3/56* (2006.01)
*G10L 21/0208* (2013.01)
(Continued)

(52) U.S. Cl.
CPC .......... *H04M 3/568* (2013.01); *G10L 21/0208* (2013.01); *G10L 21/0264* (2013.01);
(Continued)

(58) Field of Classification Search
CPC ...................................................... G10L 25/78
See application file for complete search history.

(56) References Cited

U.S. PATENT DOCUMENTS 6,169,971 B1    1/2001  Bhattacharya
6,332,153 B1 *  12/2001 Cohen ................... H04M 3/567
                                                709/203
(Continued)

FOREIGN PATENT DOCUMENTS

WO      95/02239      1/1995
WO      2007/049222   5/2007

OTHER PUBLICATIONS

L. Ferrer, L. Burget, O. Plchot, and N. Scheffer, "A unified approach for audio characterization and its application to speaker recognition," in Proc. Odyssey 2012: The Speaker and Language Recognition Workshop, pp. 317-323.*
(Continued)

*Primary Examiner* — Brian Albertalli

(57) ABSTRACT

The present document relates to audio communication systems. In particular, the present document relates to the control of the level of audio signals within audio communication systems. A method for leveling a near-end audio signal (211) using a leveling gain (214) is described. The near-end audio signal (211) comprises a sequence of segments, wherein the sequence of segments comprises a current segment and one or more preceding segments. The method comprises determining a nuisance measure (416) which is indicative of an amount of aberrant voice activity within the sequence of segments of the near-end audio signal (211); and determining the leveling gain (214) for the
(Continued)

current segment of the near-end audio signal (211), at least based on the leveling gain (214) for the one or more preceding segments of the near-end audio signal (211), and by taking into account—according to a variable degree—an estimate of the level of the current segment of the near-end audio signal (211); wherein the variable degree is dependent on the nuisance measure (416).

23 Claims, 10 Drawing Sheets

(51) Int. Cl.
    *H03G 3/32*     (2006.01)
    *G10L 21/0264*     (2013.01)
    *G10L 21/0324*     (2013.01)
    *G10L 25/84*     (2013.01)
    *H03G 3/30*     (2006.01)
    *G10L 25/78*     (2013.01)

(52) U.S. Cl.
    CPC .......... *G10L 21/0324* (2013.01); *G10L 25/84* (2013.01); *H03G 3/301* (2013.01); *H03G 3/32* (2013.01); *G10L 25/78* (2013.01); *G10L 2021/02087* (2013.01); *H04M 3/569* (2013.01)

(56) References Cited

U.S. PATENT DOCUMENTS

| | | | |
|---|---|---|---|
| 7,535,859 B2 | 5/2009 | Brox | |
| 8,380,497 B2* | 2/2013 | Mohammad | G10L 25/78 704/226 |
| 8,818,811 B2* | 8/2014 | Wang | G10L 25/78 704/210 |
| 2006/0136200 A1* | 6/2006 | Rhemtulla | H03K 19/177 704/214 |
| 2008/0162127 A1* | 7/2008 | Laaksonen | H04M 3/56 704/225 |
| 2009/0016541 A1 | 1/2009 | Goldstein | |
| 2009/0132248 A1 | 5/2009 | Nongpiur | |
| 2009/0154726 A1 | 6/2009 | Taenzer | |
| 2009/0281805 A1* | 11/2009 | LeBlanc | G10L 21/0208 704/233 |
| 2010/0017205 A1* | 1/2010 | Visser | G10L 21/02 704/225 |
| 2010/0211385 A1* | 8/2010 | Sehlstedt | G10L 25/78 704/214 |
| 2011/0026643 A1 | 2/2011 | Ruelke | |
| 2011/0033055 A1 | 2/2011 | Low | |
| 2011/0301948 A1 | 12/2011 | Chen | |
| 2012/0076311 A1 | 3/2012 | Isabelle | |
| 2013/0077538 A1* | 3/2013 | Plotnikov | H04L 12/1822 370/260 |
| 2015/0032446 A1 | 1/2015 | Dickins | |

OTHER PUBLICATIONS

Perkins, C. et al "A Survey of Packet Loss Recovery Techniques for Streaming Audio" IEEE Network, vol. 12, Issue 5, pp. 40-48, Sep.-Oct. 1998.

ITU-T G.711 "A High Quality Low-Complexity Algorithm for Packet Loss Concealment with G.711" Sep. 1999, Telecommunication Standardization Sector of ITU.

Kondo, K. "A Speech Packet Loss Concealment Method Using Linear Prediction" IEICE Transactions on Information and Systems, vol. E89-D, No. 2, pp. 806-813, publication date: Feb. 1, 2006.

ITU-T Recommendation G.722 "Appendix III: A High-Quality Packet Loss Concealment Algorithm for G.722" Nov. 2006.

\* cited by examiner

LONG TERM MONITORING OF TRANSMISSION AND VOICE ACTIVITY PATTERNS FOR REGULATING GAIN CONTROL

CROSS-REFERENCE TO RELATED APPLICATIONS

This application claims priority to U.S. Provisional Patent Application No. 61/701,861 filed 17 Sep. 2012, which is hereby incorporated by reference in its entirety.

TECHNICAL FIELD

The present document relates to audio communication systems. In particular, the present document relates to the control of the level of audio signals within audio communication systems.

BACKGROUND

In audio communication systems which allow for the exchange of audio signals between two or more endpoints (also referred to as terminals), it is desirable to control the level of the exchanged audio signals. In particular, leveling of an input audio signal is desirable in voice conferencing systems, in order to provide listeners at the one or more endpoints with equalized audio signals from each of the participants (i.e. from each of the endpoints). Typically, such voice conferencing systems comprise a system component (referred to as a leveling unit) which is responsible for determining an amount of leveling gain to apply to the input audio signal, based on some characteristics of the audio signal, thereby yielding a leveled audio signal. A challenge with the process of leveling is in ensuring that only segments of the input audio signal containing voice data are used to determine the leveling gain. Automatically differentiating between voice and non-voice data is a difficult problem and yet to be completely solved. Given a short time-frame of audio data, it is possible that some background noises can be erroneously determined as voice, notably when the background noises contain the properties that the classifying algorithm uses to characterize voice data. When the desired voice within the input audio signal is inactive, the leveling unit may erroneously identify and start to level to background noises or voice-like sounds within the input audio signal. As a result, the leveling unit may determine a leveling gain which brings up the background noises or voice-like sounds to a target level, thereby injecting undesirable noise into the communication system. Furthermore, the leveled background noises may lead to additional data being transmitted within the communication system, thereby increasing the required bandwidth of the communication system.

Possible solutions to the above mentioned technical problem are directed at restricting the range of the leveling gain or at reducing the sensitivity of the leveling unit to low level voice. However, these solutions provide a tradeoff between the ability to track and level desired low level voice signals within the input audio signal.

The present document addresses the above mentioned technical problem of leveling an input audio signal to a target level. In particular, the present document describes methods and systems for leveling, which prevent an over emphasis of undesirable background voice or noise segments within the input audio signal, while at the same time ensuring an appropriate leveling of the desired voice segments within the input audio signal.

SUMMARY

According to an aspect a method for leveling a near-end audio signal using a leveling gain is described. The leveling may be performed e.g. within an endpoint of an audio communication system (e.g. of a multi-party conference system). The endpoint may be a computing device and/or a telephone. Alternatively or in addition, the leveling may be performed by a network server of the audio communication system (e.g. by a central conference server). The near-end audio signal may be an audio signal captured by a transducer (e.g. a microphone) of the endpoint. The near-end audio signal may comprise a sequence of segments, wherein the sequence of segments comprises a current segment and one or more preceding segments. A segment of the audio signal may e.g. be a frame or a block of the audio signal. The segment of the audio signal may have a pre-determined length or duration (e.g. 20 ms).

The method may comprise determining a nuisance measure. The nuisance measure may be indicative of an amount of aberrant voice activity within the sequence of segments of the near-end audio signal. In other words, the nuisance measure may be indicative of an amount of activity within the sequence of segments of the near-end audio signal, which is wrongly identified as being due to the voice of the talker at the (near-end) endpoint of the audio communication system. In yet other words, the nuisance measure may be indicative of the amount of segments of the near-end audio signal which have been (or which had previously been) wrongly classified as being voice segments (even thought they do not comprise a voice signal of the talker at the near-end endpoint). The wrong classification may be due e.g. to background noise (such as typing). In yet other words, the nuisance measure may be indicative of the fact that even though initially a segment is identified based on a threshold and/or based on voice activity detection (short term) that the segment comprises voice, it may be learned over time that the segment did not comprise non-nuisance voice (e.g. because the duration of voice segments was too short, because the segment did not excite a more specific classifier, because a far-end endpoint was active whilst the near-end segments were continually identified to comprise voice, etc.).

The nuisance measure may be indicative of such aberrant voice activity within the recent history of the near-end audio signal (e.g. within a pre-determined time interval prior to the current segment of the near-end audio signal). For this purpose, the method may analyze the near-end audio signal and/or one or more far-end audio signals. As indicated above, the near-end audio signal is typically derived from an audio signal captured by one or more microphones of a near-end endpoint of an audio communication system. The one or more far-end audio signals are typically to be rendered by a speaker (e.g. a loudspeaker or headphones) of the near-end endpoint. Furthermore, the one or more far-end audio signals have typically been captured by the microphones of one or more corresponding far-end endpoints of audio communication system.

The method may further comprise determining the leveling gain for the current segment of the near-end audio signal. The leveling gain may be determined at least based on the leveling gain for the one or more preceding segments of the near-end audio signal. In particular, the leveling gain for the current segment may be determined in a recursive manner by updating the leveling gain for the one or more preceding segments, e.g. by updating the leveling gain for the directly preceding segment of the near-end audio signal.

Furthermore, the leveling gain may be determined by taking into account—according to a variable degree—an estimate of the level of the current segment of the near-end audio signal. The variable degree may be dependent on the nuisance measure. By way of example, the variable degree may be set to zero, i.e. the leveling gain for the current segment may be determined independently from the estimate of the level of the current segment. This may be the case subject to the condition that the nuisance measure indicates an amount of aberrant voice activity which exceeds a pre-determined nuisance threshold, e.g. subject to the condition that the nuisance measure itself exceeds the pre-determined nuisance threshold. In such cases, the method may comprise the step of suspending the updating of the leveling gain (and of maintaining the leveling gain at a constant level).

In addition, the method may comprise applying the leveling gain to the current segment of the near-end audio signal. By way of example, the samples of the current segment may be multiplied with the leveling gain.

As indicated above, the nuisance measure may be determined at least based on the sequence of segments of the near-end audio signal. For this purpose, the method may make use of voice activity detection schemes. In particular, the method may comprise classifying the sequence of segments into voice segments and non-voice segments using voice activity detection. By way of example, the method may comprise determining a probability that a particular segment of the near-end audio signal comprises voice (i.e. voice which is due to the talker at the near-end endpoint). The particular segment may be classified to be a voice segment (i.e. comprising voice which is due to the talker at the near-end endpoint), if the probability exceeds a pre-determined probability threshold. Otherwise the particular segment may be classified to be a non-voice segment. The probability may be determined subsequent to the transmission or classification of the segments. The probability may be determined based on a length of a sequence of consecutive voice segments or of a sequence of consecutive non-voice segments, based on the activity of a far-end audio signal and/or based on a ratio of detected voice to non-voice segments.

The step of determining the nuisance measure may comprise determining a duration (or a number of segments) of a voice burst of the near-end audio signal, wherein a voice burst comprises one or more successive voice segments. The nuisance measure may depend on the duration of the voice burst. In particular, the step of determining the nuisance measure may comprise increasing the amount of aberrant voice activity indicated by the nuisance measure, if the duration of the voice burst is below a first duration threshold value. By way of example, the nuisance measure may be increased, if such a short voice burst has been determined. Such a short voice burst (and in particular a relatively high density of short voice bursts may be an indication of aberrant voice activity within the near-end audio signal). On the other hand, if the duration of the voice burst is above a second duration threshold value (wherein the second duration threshold value is typically equal to or greater than the first duration threshold value), the method may proceed with decreasing the amount of aberrant voice activity indicated by the nuisance measure (e.g. with decreasing the nuisance measure). The amount of increase and/or decrease of the amount of aberrant voice activity (or of the nuisance measure) may be dependent on the duration of the voice burst.

As such, the nuisance measure may be indicative of a distribution of durations of voice bursts comprised within the input audio signal. A high amount of short voice bursts typically increases the amount of aberrant voice activity indicated by the nuisance measure (as such short voice bursts are an indication of false classifications by the voice activity detection scheme). On the other hand, voice bursts of a relatively higher length typically decrease the amount of aberrant voice activity indicated by the nuisance measure (as such longer voice bursts are an indication of actual voice activity by the talker at the near-end endpoint).

The step of determining the nuisance measure may comprise determining a duration (or a number) of successive non-voice segments. The nuisance measure may depend on the duration of successive non-voice segments. In particular, if the duration of successive non-voice segments is above a third duration threshold value, the amount of aberrant voice activity indicated by the nuisance measure may be decreased. By way of example, the nuisance measure may be submitted to a decay, wherein the decay is dependent on the duration of successive non-voice segments. As such, it is ensured that the nuisance measure is indicative of the recent history of aberrant voice activity, whereas aberrant voice activity which lies further back is "forgotten".

As indicated above, the nuisance measure may be determined, alternatively or in addition, at least based on a sequence of segments of one or more far-end audio signals. Determining the nuisance measure may comprise determining a voice activity within the sequence of segments of the one or more far-end signals. The voice activity within the sequence of segments of a far-end signal may be determined by determining energies of the segments of the far-end signal. The energy of a segment may e.g. be determined based on the squared amplitudes of the samples of the segment of the audio signal. The voice activity within a far-end signal may also be determined based on voice activity detection. In particular, the voice activity of the far-end audio signal may be determined by classifying the sequence of segments of the far-end signal into voice segments and non-voice segments using voice activity detection. The step of determining the nuisance measure may comprises increasing the amount of aberrant voice activity indicated by the nuisance measure, if voice activity is detected in the far-end signal. As such, voice activity within the one or more far-end audio signals may be taken into account of as an indicator for aberrant voice activity in the near-end audio signal.

As indicated above, the nuisance measure may be used to control the determination (and in particular the updating) of the leveling gain. The step of determining the leveling gain may comprise determining whether the nuisance measure exceeds a nuisance threshold. If the nuisance measure exceeds the nuisance threshold, the variable degree may be set such that the leveling gain for the current segment of the near-end audio signal is independent of the estimate of the level of the current segment of the near-end audio signal. By way of example, the variable degree may be set to zero. In particular, if the nuisance measure exceeds the nuisance threshold, the leveling gain may be set to be equal to the leveling gain for the segment of the near-end audio signal, which is directly preceding the current segment of the near-end audio signal. In other words, the updating of the leveling gain may be suspended (and the leveling gain may be kept constant), if it is determined that the nuisance measure indicates an amount of aberrant voice activity which exceeds the pre-determined nuisance threshold.

On the other hand, the updating of the leveling gain may be re-enabled, if the nuisance measure falls below the nuisance threshold (e.g. subject to a decay or a reset of the nuisance measure). In other words, if it is determined that the amount of aberrant voice activity indicated by the nuisance measure falls below the pre-determined nuisance threshold, the updating of the leveling gain (which takes into account the estimate of the level of the current segment of the near-end audio signal) is re-enabled.

The step of determining the leveling gain may comprise determining a probability that the current segment of the near-end audio signal comprises voice, using voice activity detection. The voice activity detection (VAD) used for determining the leveling gain may differ from the VAD used for classifying the sequence of segments into voice segments and non-voice segments, when determining the nuisance measure. In particular, the VAD used for determining the leveling gain may be more selective (i.e. may have a higher selectivity). Thus, one may choose to transmit segments with a relatively high sensitivity, but learn as the segments proceed the amount of voice activity in the segments with higher specificity. Furthermore, it should be noted that the step of determining a probability that the current segment of the near-end audio signal comprises voice may be performed subsequent to the initial classification of the current segment, wherein the initial classification of the current segment is typically used for making a transmission decision for the current segment. In particular, the step of determining a probability that the current segment of the near-end audio signal comprises voice may be performed subsequent to the transmission of the current segment.

The probability that the current segment of the near-end audio signal comprises voice may be weighted with a weighting factor, thereby yielding a weighted probability. The weighting factor may depend on the nuisance measure. In particular, the weighting factor may be such that the weighted probability is decreasing if the amount of aberrant voice activity indicated by the nuisance measure increases. In other words, the weighting factor may decrease the probability that the current segment of the near-end audio signal comprises voice, if the nuisance measure indicates a high amount of aberrant voice activity (e.g. if the nuisance measure has a high value). As such, the nuisance level may impact the weighted probability and thereby impact the updating of the leveling gain (thereby yielding a short term impact on the updating of the leveling gain). Alternatively or in addition, the probability may impact the nuisance level and thereby provide a long term impact on the updating of the leveling gain. In particular, if it is determined that the probability and/or an accumulated ratio of voice segments within a sequence of segments is below a pre-determined threshold, the nuisance level may be increased.

The updating of the leveling gain may be performed in dependence on the weighted probability. By way of example, if the weighted probability exceeds a probability threshold value, the leveling gain for the current segment of the near-end audio signal may be determined by taking into account the estimate of the level of the current segment of the near-end audio signal. On the other hand, if the weighted probability lies below the probability threshold value, the updating of the leveling gain may be suspended (i.e. the leveling gain may be kept constant). In other words, if the weighted probability does not exceed the probability threshold value, the leveling gain for the current segment of the near-end audio signal may be determined without taking into account the estimate of the level of the current segment of the near-end audio signal.

The step of determining the leveling gain by taking into account the estimate of the level of the current segment of the near-end audio signal may comprise determining a current estimate of the voice level of the near-end audio signal at least based on a previous estimate of the voice level of the near-end audio signal and at least based on the estimate of the level of the current segment of the near-end audio signal. The leveling gain for the current segment of the near-end audio signal may be determined such that the current estimate of the voice level of the near-end audio signal corresponds to a target level.

According to another aspect, a method for leveling an audio signal using a leveling gain is described. The audio signal may e.g. be the near-end audio signal. The audio signal typically comprises a sequence of segments. The method may comprise any of the features described in the present document. In particular, the method may comprise the steps of updating the leveling gain for a current segment of the audio signal based on a target level. The updating of the leveling gain may be performed as described in the present document. In particular, the updating may be performed in a recursive manner, based on the leveling gain for one or more preceding segments of the audio signal. Furthermore, the method comprises applying the leveling gain to the current segment of the audio signal. The updating and applying steps are typically repeated—on a segment by segment basis—for the sequence of segments of the audio signal. However, the updating of the leveling gain may be suspended (i.e. the leveling gain may be maintained constant), subject to determining a pre-determined number of aberrant voice bursts within the audio signal (e.g. by determining that the nuisance measure exceeds the pre-determined nuisance threshold value).

The method may comprise classifying the sequence of segments into voice segments and non-voice segments (e.g. using voice activity detection). An aberrant voice burst typically comprises a number of successive voice segments which is at or below a pre-determined threshold value. In particular, an aberrant voice burst may have a duration which is below the first duration threshold value. Alternatively or in addition, an aberrant voice burst typically comprises a number of successive earlier identified voice segments, for which a later estimated voice probability is at or below a pre-determined threshold. As such, the method may suspend the updating of the leveling gain, if a relatively high amount of short voice bursts has been determined.

The method may further comprise determining a nuisance measure which is indicative of an amount of aberrant voice activity within the sequence of segments of the audio signal. The nuisance measure may be determined as described in the present document. In particular, the nuisance measure may be increased upon detection of an aberrant voice burst within the audio signal. The updating of the leveling gain may be suspended, if the nuisance measure exceeds the pre-determined nuisance threshold value.

On the other hand, the method may comprise applying a decay factor to the nuisance measure (in order to reflect a limited memory of the nuisance measure). The updating of the leveling gain may be re-enabled, if the nuisance measure falls below the pre-determined nuisance threshold value. The decay factor determines how quickly the updating of the leveling gain is re-enabled. In other words, the decay factor determines a temporal length of the memory of the nuisance measure.

The method may comprise re-enabling the updating of the leveling gain, subject to determining a voice burst within the audio signal, which exceeds a pre-determined burst duration (e.g. the second duration threshold value). In particular, the method may comprise determining a length of a voice burst within the audio signal, and resetting the nuisance measure, if the length of the voice burst exceeds a pre-determined duration threshold value (e.g. the second duration threshold value). Alternatively or in addition, the nuisance measure may be reset, if an ongoing ratio of voice to non-voice segments exceeds a certain threshold after a set time, e.g. if the voice burst is longer than 2-3 seconds, or if after is a ratio of voice to non-voice segments is >90%.

According to a further aspect, a leveling unit configured to level a near-end audio signal using a leveling gain is described. The near-end audio signal comprises a sequence of segments, wherein the sequence of segments comprises a current segment and one or more preceding segments. The leveling unit may comprise a nuisance determination module configured to determine a nuisance measure which is indicative of an amount of aberrant voice activity within the sequence of segments of the near-end audio signal. Furthermore, the leveling unit may comprise a gain control module configured to determine the leveling gain for the current segment of the near-end audio signal, at least based on the leveling gain for the one or more preceding segments of the near-end audio signal. In addition, the leveling gain may be determined by taking into account—according to a variable degree—an estimate of the level of the current segment of the near-end audio signal. In addition, the leveling unit may comprise a regulator module configured to determine the variable degree based on (or by taking into account) the nuisance measure.

According to a further aspect, a leveling unit configured to level an audio signal using a leveling gain is described. The audio signal (e.g. the near-end audio signal) comprises a sequence of segments. The leveling unit may be configured to update the leveling gain for a current segment of the audio signal based on a target level, and to apply the leveling gain to the current segment of the audio signal. The leveling unit may be configured to repeat the updating and applying for the sequence of segments of the audio signal. Furthermore, the leveling unit may be configured to suspend the updating of the leveling gain, subject to determining a pre-determined number of aberrant voice bursts (within a pre-determined time interval of the audio signal) within the audio signal.

It should be noted that in a similar manner to impacting the update of the leveling gain, the nuisance measure may be used to control the update of the voice level estimate (which then impacts the leveling gain). The gain control is typically directed at tracking the leveling gain such that the level estimate converges to (and would be effectively at) the target level. Hence, controlling the level update effectively controls the updating of the leveling gain. As such, the time constants and leveling control aspects outlined in the present document can be applied to the update of the level estimate and/or to the update of the leveling gain.

According to a further aspect, a software program is described. The software program may be adapted for execution on a processor and for performing the method steps outlined in the present document when carried out on the processor.

According to another aspect, a storage medium is described. The storage medium may comprise a software program adapted for execution on a processor and for performing the method steps outlined in the present document when carried out on the processor.

According to a further aspect, a computer program product is described. The computer program may comprise executable instructions for performing the method steps outlined in the present document when executed on a computer.

It should be noted that the methods and systems including its preferred embodiments as outlined in the present patent application may be used stand-alone or in combination with the other methods and systems disclosed in this document. Furthermore, all aspects of the methods and systems outlined in the present patent application may be arbitrarily combined. In particular, the features of the claims may be combined with one another in an arbitrary manner.

SHORT DESCRIPTION OF THE FIGURES

The invention is explained below in an exemplary manner with reference to the accompanying drawings, wherein FIG. 1a shows a block diagram of an example centralized multi-party conference system;

FIG. 3b shows burst length distributions for the plurality of different example input audio signals of FIG. 3a;

DETAILED DESCRIPTION

As outlined in the introductory section, the present document relates to audio communication systems. In particular, the present document relates to the leveling of audio signals which are exchanged within such audio communication systems. Leveling is particularly beneficial in a multi-party audio conference system, in order to ensure that a listening participant of the multi-party audio conference perceives a plurality of audio signals which originate from a corresponding plurality of other participants at appropriate levels (e.g. at equal levels). In the following, the methods and systems for leveling input audio signals are described in the context of a multi-party audio conference system. It should be noted, however, that the methods and systems for leveling input audio signals are applicable to audio communication systems (e.g. point-to-point audio communication systems) in general. In particular, the methods and systems described in the present document may be applied to audio communication systems comprising multiple endpoints with single users (since device characteristics and users may be unknown) and/or single endpoints with multiple users (since device characteristics and users may be unknown, and since users and distance may change during a call).

Figure 1A:
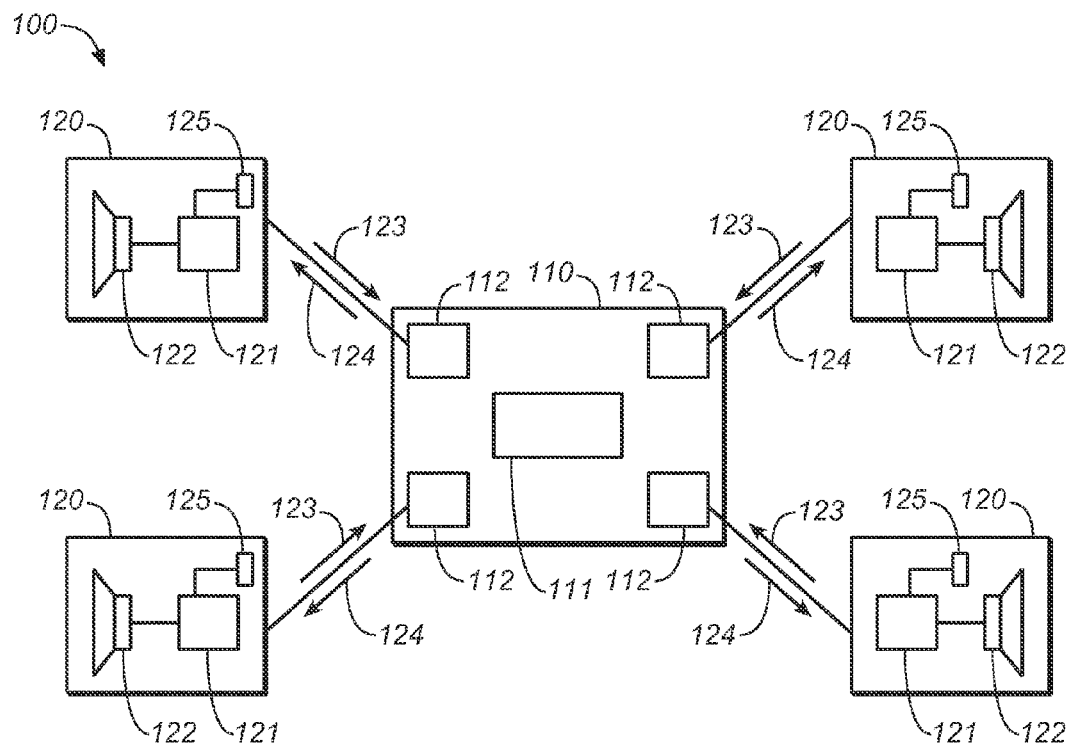
FIG. 1b shows a block diagram of an example de-centralized multi-party conference system.

FIG. 1a illustrates an example multi-party audio conference system 100 with a centralized architecture. A centralized conference server 110 receives a plurality of upstream audio signals 123 from a respective plurality of terminals 120 (also referred to as endpoints 120 in the present document). The terminals 120 comprise respective transceivers 125 (e.g. microphones) to convert acoustic signals at the terminals 120 into respective upstream audio signals 123. An upstream audio signal 123 is typically transmitted as an audio stream, e.g. a bitstream. By way of example, an upstream audio signal 123 may be encoded as a G.711, a G722.2 (AMR-WB), a MPEG2 or a MPEG 4 audio bitstream or any other standard or proprietary single or multi-channel audio codec. Typically, though not exclusively, the upstream audio signal 123 is a mono audio signal. The centralized conference server 110 (e.g. the audio servers 112 comprised within the conference server 110) may be configured to decode the upstream audio streams (representing the upstream audio signals 123) and to extract optional metadata associated with upstream audio streams.

The conference server 110 may e.g. be an application server of an audio conference service provider within a telecommunication network. The terminals 120 may e.g. be computing devices, such as laptop computers, desktop computers, tablet computers, and/or smartphones; as well as telephones, such as mobile telephones, cordless telephones, desktop handsets, etc. The conference server 110 comprises a central conference controller 111 configured to combine the plurality of upstream audio signals 123 to form an audio conference. The central conference controller 111 may be configured to mix the plurality of upstream audio signals 123. Furthermore, the central conference controller 111 may be configured to place the plurality of upstream audio signals 123 at particular locations within a 2D or 3D conference scene (e.g. using binauralization techniques) and generate information regarding the arrangement (i.e. the locations) of the plurality of upstream audio signals 123 within the conference scene.

Furthermore, the conference server 110 may comprise a plurality of audio servers 112 for the plurality of terminals 120, respectively. It should be noted that the plurality of audio servers 112 may be provided within a single computing device/digital signal processor. The plurality of audio servers 112 may e.g. be dedicated processing modules within the server or dedicated software threads to service the audio signals for the respective plurality of terminals 120. Hence, the audio servers 112 may be "logical" entities which process the audio signals in accordance to the needs of the respective terminals 120. An audio server 112 (or an equivalent processing module or thread within a combined server) receives some or all of the plurality of upstream audio signals 123 (e.g. in the form of audio streams), and optionally the information regarding the arrangement of the plurality of upstream audio signals 123 within the conference scene. The information regarding the arrangement of the plurality of upstream audio signals 123 within the conference scene is typically provided by the conference controller 111 which thereby informs the audio server 112 (or processing module/thread) on how to process the audio signals. Using this information, the audio server 112 generates a set of downstream audio signals 124, as well as corresponding metadata, which is transmitted to the respective terminal 120, in order to enable the respective terminal 120 to render the audio signals of the participating parties in accordance to the conference scene established within the conference controller 111. The set of downstream audio signals 124 is typically transmitted as a set of downstream audio streams, e.g. bitstreams. By way of example, the set of downstream audio signals 124 may be encoded as G.711, G722.2 (AMR-WB), MPEG2 or MPEG 4 or other standard or proprietary audio bitstreams. The information regarding the placement of the downstream audio signals 124 within the conference scene may be encoded as metadata e.g. within the set of downstream audio streams. Hence, the conference server 110 (in particular the audio server 112) may be configured to encode the set of downstream audio signals 124 into a set of downstream audio streams comprising metadata for rendering the conference scene at the terminal 120.

Figure 1B:
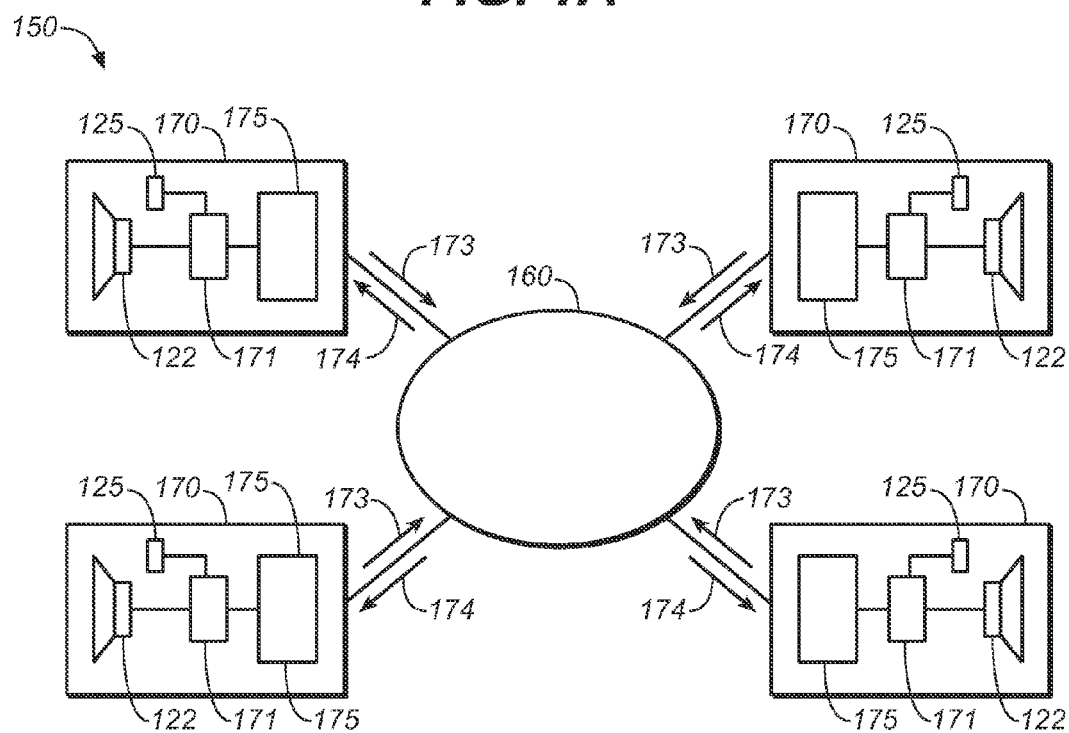

FIG. 1a illustrates a conference system 110 with a centralized architecture. Voice conference (e.g. using 2D or 3D audio conference scenes) may also be provided using a distributed architecture, as illustrated by the conference system 150 of FIG. 1b. In the illustrated example, the terminals 170 comprise a local conference controller 175 configured to mix the audio signals of the conference participants and/or to place the audio signals into a conference scene. In a similar manner to the central conference controller 111 of the centralized conference server 110, the local conference controller 175 may be limited to analyzing the signaling information of the received audio signals in order to generate a conference scene. The actual manipulation of the audio signals may be performed by a separate audio processing unit 171.

A terminal 120, 170 receives a set of downstream audio signals 124 (and the corresponding metadata) and renders the set of downstream audio signals 124 via the audio transceiver 122 (e.g. headphones or loudspeakers). For this purpose, the terminal 120 (e.g. an audio processing unit 121 comprised within the terminal 120) may be configured to decode a set of downstream audio bitstreams, in order to extract the downstream audio signals and the corresponding metadata. Furthermore, the audio processing unit 121 may be configured to generate a mixed binaural audio signal for rendering by the audio transceiver 122, wherein the mixed binaural audio signal reflects the terminal specific conference scene designed at the conference server 110 for this terminal 120. In other words, the audio processing unit 121 may be configured to analyze the received metadata and to place the received set of downstream audio signals 124 into the terminal specific conference scene. As a result, the conference participant may perceive a binaural audio signal which gives the conference participant at the terminal 120 the impression that the other participants are placed at specific locations within a conference scene.

In a distributed architecture, a terminal 170 is configured to send its upstream audio signal 173 (e.g. as a bitstream) to the other participating terminals 170 via a communication network 160. For this purpose, the terminal 170 may use multicasting schemes and/or direct addressing schemes of the other participating terminals 170. Hence, in case of M participating terminals 170, each terminal 170 receives up to (M−1) downstream audio signals 174 (e.g. as bitstreams) which correspond to the upstream audio signals 173 of the (M−1) other terminals 170. The local conference controller 175 of a receiving terminal 170 may be configured to place the received downstream audio signals 174 into a 2D or 3D conference scene, wherein the receiving terminal 170 is typically placed in the center of the conference scene. The audio processing unit 171 of the receiving terminal 170 may be configured to generate a mixed binaural signal from the received downstream audio signals 174, wherein the mixed binaural signal reflects the 2D or 3D conference scene designed by the local conference controller 175. The mixed binaural signal may then be rendered by the audio transceiver 122.

The present document addresses the technical problem of leveling the plurality of upstream audio signals 123 to a respective plurality of target levels. The target levels may be equal for all terminals 120, 170. On the other hand, the target levels may depend on the position of the terminal 120, 170 within the 2D/3D conference scene. By way of example, the target level of an upstream audio signal 123 may decrease with increasing distance of the location of the corresponding terminal 120, 170 within the conference scene from the listener location.

The leveling of an upstream audio signal 123 may be performed at different places within the conference system 100, 150. By way of example, a terminal 120, 170 may be configured to level the input audio signal captured by the transceiver 125, thereby yielding a leveled upstream audio signals 123 which is transmitted. Alternatively or in addition, the centralized conference server 110 (e.g. the audio servers 112) may be configured to level the received upstream audio signals 123, in the context of building the conference scene to and/or in the context of generating the downstream audio signals 124 which are transmitted to the respective terminals 120. Alternatively or in addition, a terminal 120, 170 may be configured to level a received downstream audio signal 124, thereby yielding a leveled downstream audio signal for rendering by the audio transceiver 122. As such, the leveling unit described in the present document may be incorporated e.g. in the terminals 120, 170 and/or in the central conference server 110.

As outlined above, the present document lies in the area of voice processing, as may be performed on an input audio signal from a microphone or microphones, or from an unknown audio source, in order to condition and/or prepare the input audio signal for use in a communications system. The voice processing is typically affected by a trade-off between two desirable parameters, notably the depth of noise suppression and the quality of the retained voice. This document specifically relates to a system which levels the desired voice within the input audio signal, and which provides a balance between the sensitivity of leveling to lock onto low level voice and the tendency to track undesirable background voice and noise, in particular in situations when the corresponding conference participant has not spoken for some time. The second aspect of the trade-off, i.e. the tendency of a leveling unit to level the input audio signal based on undesirable background voice and noise comprised within the input audio signal, may be referred to as "creep".

Figure 2A:
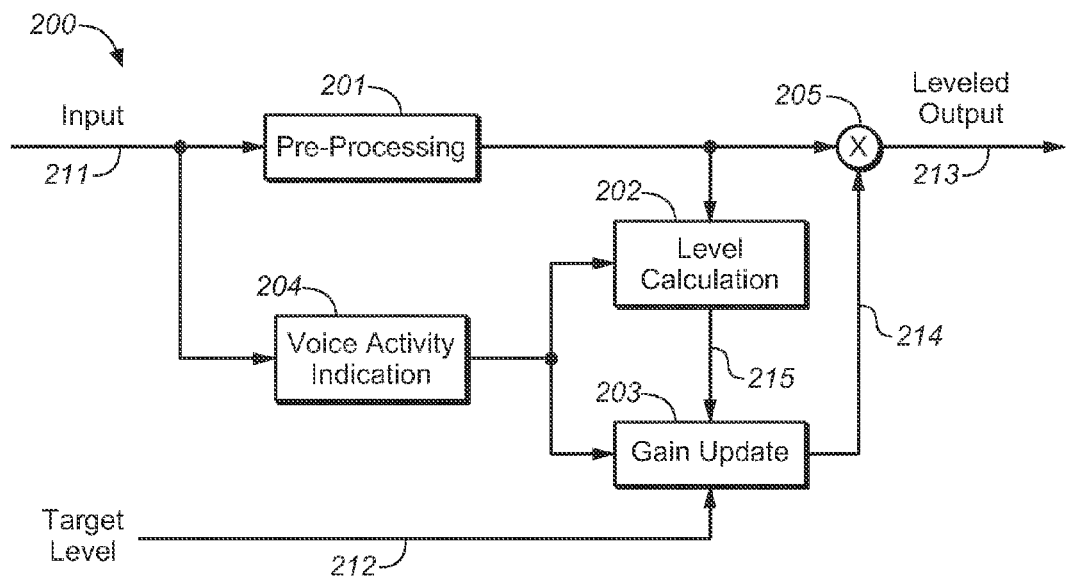
FIG. 2a illustrates a block diagram of an example leveling unit.

FIG. 2a shows a block diagram of an example leveling unit 200. The leveling unit 200 may comprise a pre-processing module 201 which is configured to perform signal processing on the input audio signal 211. Examples for such signal processing may e.g. be echo compensation, filtering using an equalization filter, etc. As outlined above, the input audio signal 211 may be the audio signal captured by the microphone 125 of the terminal 120, 170, the upstream audio signal 123 or the downstream audio signal 124, depending on where the leveling of the audio signal is performed. Typically, the input audio signal 211 comprises a sequence of samples at a sample rate, wherein the sequence of samples may be structured in blocks or frames which cover a pre-determined length of the input audio signal 211 (e.g. 20 ms).

The leveling unit 200 typically comprises a Voice Activity Indication module 204 (also referred to as VAD module 204) which may be configured to perform Voice Activity Detection (VAD) schemes on the input audio signal 211, thereby providing an indication (e.g. a probability P) of the Voice Activity within a segment n (e.g. a frame or block) of the input audio signal 211. Example VAD schemes may perform noise reduction (e.g. via spectral subtraction). Furthermore, the VAD schemes may perform feature extraction based on the segment n of the input audio signal 211. In addition, one or more classification rules may be applied to the extracted features, in order to classify the segment n of the input audio signal 211 as voice or a non-voice, thereby yielding a classification C(n) for the segment n. Alternatively or in addition, an indicator of the reliability of the classification (e.g. the probability P(n)) may be determined. The probability P(n) may indicate the probability that the segment n comprises voice. As such, the VAD module 204 may provide a sequence of classifications C(n) and/or a sequence of probabilities P(n) for a sequence of segments n=1, . . . , N of the input audio signal 211.

The output of the VAD module 204, notably the sequence of classifications C(n) and/or the sequence of probabilities P(n), may be used by the terminal 120, 170 to determine the upstream audio signal 123 (which is to be transmitted) from the input audio signal 211. In particular, the output of the VAD module 204 may be used to reduce the bandwidth of the upstream audio signal 123. By way of example, the terminal 120, 170 may be configured to not transmit a segment n of the input audio signal 211, if the corresponding classification C(n) is non-voice and/or if the corresponding probability P(n) that the segment n comprises voice is below a pre-determined probability threshold.

Furthermore, the leveling unit 200 may comprise a level determination module 202 which is configured to determine an estimate L 215 of the level of the voice segments comprised within the input audio signal 211. In other words, the level determination module 202 is configured to determine an estimate L 215 of the level of only those segments of the input audio signal 211, during which a talker at the terminal 120, 170 is really talking; while ignoring those segments of the input audio signal 211, during which the talker is silent. The level of an audio signal may be determined based on the energy E of the audio signal. The embodiment presented here is given for a single dimensional energy E derived from the present audio signal. It should be apparent to one skilled in the art that envisaged embodiments could also encompass a weighted energy that is contributed to differently depending on the input frequency, and/or on a set of spectrally dependent energy measures to that correspond to different frequency bands or spectrum ranges across which the voice level is reasonably thought to be present. The energy E of an audio signal may be determined based on the squared amplitude of the samples of the audio signal (e.g. the energy E(n) of a segment n may be determined based on an average of the squared amplitudes of the samples within the segment n). As the level of the audio signal may vary along the time line, the estimate L 215 may be updated at regular time intervals, e.g. at a pre-determined level update rate $f_L$. The level update rate $f_L$ may correspond to the rate of segments n of the audio signal. The update of the level estimate L 215 may be performed in a recursive manner based on one or more previous estimates. The speed (or extent) of update may be controlled by one or more time constants. By way of example, the estimate L(n) 215 for the segment n (i.e. at a particular time instant) may be updated based on the estimate L(n−1) for the previous segment (n−1) by:

$$L(n)=\alpha_L*L(n-1)+(1-\alpha_L)*E(n),$$

wherein $\alpha_L$ is the time constant for the level calculation and wherein E(n) is an energy of the segment n of the input audio signal 211.

The level determination module 202 may be configured to exclude segments n from the calculation of the level estimate L 215, based on the output of the VAD module 204. By way of example, segments n of the input audio signal 211 which have a non-voice classification C(n) and/or a probability P(n) of voice which is below a pre-determined probability threshold may be excluded from the determination of the level estimate L. In such cases, the level L(n) may be kept unchanged, e.g. L(n)=L(n-1). By excluding those segments n of the input audio signal 211, which most likely do not comprise voice from the talker, the level estimate L(n) may be adapted to estimate the level of the actual voice comprised within the input audio signal 211. In this document, the estimate L(n) of the level of voice comprised within the input audio signal 211 will be referred to a level L(n) or voice level estimate L(n) in brief.

The leveling unit 200 may further comprise a gain update module 203 which is configured to determine a leveling gain G(n) 214 which is to be applied by an amplifier 205 to the segment n of the (possibly processed) input audio signal 211, thereby yielding the leveled audio signal 213 (also referred to as the leveled output signal 213). The leveling gain G(n) 214 may be determined such that the leveled audio signal 213 is at a target level $L_T$ 212 (e.g. is in average at the target level $L_T$ 212).

Due to a varying level L(n) of the input audio signal 211, the gain update module 203 may be configured to regularly update the leveling gain G(n). In a similar manner to the level L(n) 215, the leveling gain G(n) 214 may be updated at a pre-determined gain update rate $f_G$. The gain update rate $f_G$ may correspond to the rate of segments n of the input audio signal 211. The update of the gain G may be performed in a recursive manner based on one or more previous gains. The speed (or extent) of update may be controlled by one or more time constants. By way of example, the gain G(n) for the segment n may be updated based on the gain G(n-1) for the previous segment (n-1) by:

$$G(n)=\alpha_G*G(n-1)+(1-\alpha_G)*L(n)/L_T,$$

wherein $\alpha_G$ is the time constant for the gain update. In an embodiment, the gain may be determined as $$G(n)=L(n)/L_T.$$

In the previous examples, it should be evident to those skilled in the art that the recursive averaging of the level and/or gain is feasible in a logarithmic or polynomial domain mapped from the original energy definitions. Furthermore, the gain update activity can be a filtered gain or some constant slew update of gain, with the common goal of tracking such that $L(n) \sim L_T$. The leveling unit 200 comprises various parameters which may be tuned, in order to ensure that the actual voice segments of the input audio signal 211 are at the target level $L_T$ 212 (in average, e.g. in average across a pre-determined time interval). The various parameters are e.g. the level update rate $f_L$, the gain update rate $f_G$, the level time constant $\alpha_L$, the gain time constant $\alpha_G$, parameters (e.g. the sensitivity) of the VAD module 204, etc. By way of example, the sensitivity of the VAD module 204 may be increased, thereby increasing (in average) the number of segments of the input audio signal 211, which are classified as voice and/or thereby increasing (in average) the probabilities P(n). This will typically lead to an increased quality of the retained voice within the input audio signal 211 (as the terminal 120, 170 will transmit a higher amount of segments of the input audio signal 211). On the other hand, this may lead to an increased number of false classifications and as a consequence to an overly high leveling gain G 215. In particular, this may lead to a gradual increase of the leveling gain 215 along the time line (notably during periods where no actual voice activity occurs within the input audio signal 211). This phenomenon may be referred to as "creep". As a consequence, the noise within the audio communication system will be increased.

Possible approaches to reducing or for avoiding "creep" are the following. These approaches may be used alone or in arbitrary combination.

Figure 2B:
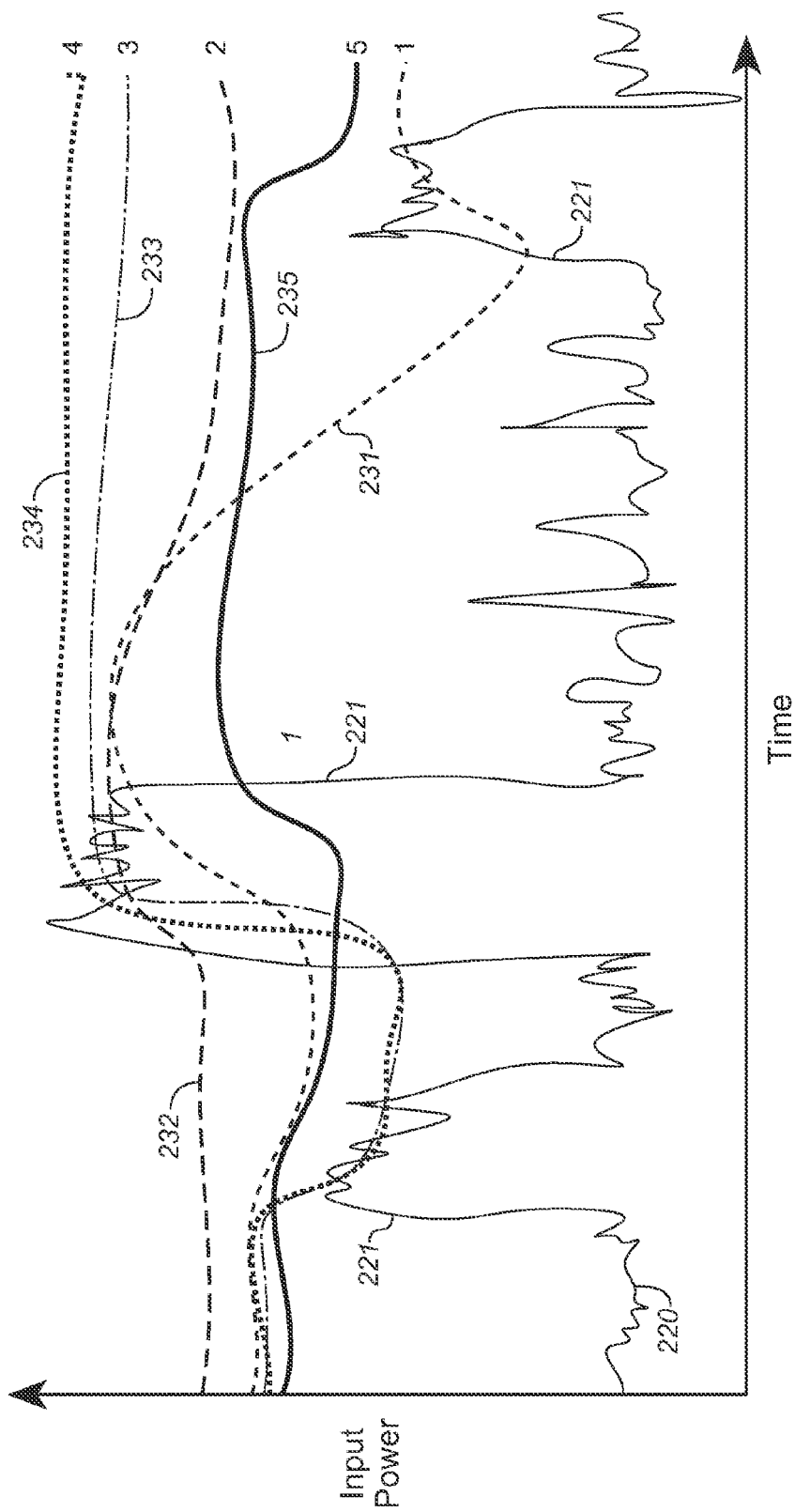
FIG. 2b shows estimates of the voice level for an example input audio signal.

1) Adjusting the time constants for level update and/or for gain update. As a consequence, "creep" is typically slowed down, however, at the expense of a slow level adjustment for actual voice (i.e. for the desired segments of the input audio signal 211). This is illustrated by the level curve L(n) 231 of FIG. 2b which shows the updated level L(n) 231 for an input audio signal 211 having the input power 220. As can be seen, the input power 220 has bursts 221 of relatively high power, which most likely correspond to bursts of actual voice. It can be seen that the level L(n) 231 is delayed with respect to the bursts 221. As a consequence, the leveling gain G(n) will be too high at the beginning of a burst of actual voice.
2) The range of possible leveling gains 214 and/or levels 215 may be restricted. In other words, G(n) may be bound by $[G_{min}, G_{max}]$ and/or L(n) may be bound by $[L_{min}, L_{max}]$. By way of example, $G_{min}=-10$ dB and/or $G_{max}=40$ dB (e.g. for PSTN). An example level curve 232 for this approach is shown in FIG. 2b.
3) The voice sensitivity used within the Voice Activity Indication module 204 may be lowered. This may lead to a challenge in leveling to a low desired voice level. An example level curve 233 for this approach is shown in FIG. 2b.
4) The level 215 may be locked onto the loudest voice segment and may then be held. A fault mode with loud sounds may cause the subsequent loss of leveling to the desired voice segments. An example level curve 234 for this approach is shown in FIG. 2b.
5) A fraction (e.g. 1 s) at the beginning of a voice burst may be ignored. This approach may be used to remove faulty classifications. On the other hand, this approach typically creates a lag in the leveling to loud or soft voice activity, and a biased voice level estimate, since the onset of voice generally has a higher level. An example level curve 235 for this approach is shown in FIG. 2b.

The above mentioned approaches are independent of the input audio signal 211 which is to be leveled. In particular, the above mentioned approaches select and fix parameters of the leveling unit 200, such as time constants, ranges, sensitivity, hold and hysteresis in the voice level and gain calculation, independent from the type of input audio signal 211 which is to be leveled. As such, the above mentioned approaches may have poor performance for certain types of input audio signals 211.

In the present document, it is proposed to use a trend and/or a behavior within the input audio signal 211 over a plurality of segments n of the input audio signal 211 to control the parameters of the leveling unit 200. In particular, a trend and/or a behavior within the input audio signal 211 over a plurality of segments n of apparent voice activity of the input audio signal 211 may be taken into account for controlling the parameters of the leveling unit 200. In particular, the rate at which the level 215 and/or the gain 214 are updated may be controlled and/or the time constants for updating the level 251 and/or the gain 214 may be controlled. An example trend or behavior of the input audio signal 211 is a string of short voice activity bursts or transmissions. Such a trend or behavior may indicate an abnormal speech pattern, and may lead to restrained leveling.

It should be noted that the restrained leveling should be achieved without altering the general rate at which leveling takes place, or where the generally tuned rate of leveling was an appropriate compromise of the approaches listed above, the leveling may be achieved with an increased rate. In other words, the leveling should only be restrained during periods of abnormal speech patterns, wherein during normal conversation, the general rate at which leveling takes place should not be altered or may be substantially increased. By way of example, during normal conversation, a short impulsive speech activity could signal an expletive or abusive, which should be incorporated in the voice level estimate and/or the leveling gain update. As detailed above, a system that simply ignores the first segment of any voice activity can result in slow leveling and/or a biased voice level estimate due to the correlation between speech onset and louder vocalizations. Rather than any logic or decision based on the present talk burst, it is proposed in the present document to utilize an observation of burst duration over a period of time, and to utilize a set of rules for accumulating and decaying a so called nuisance measure.

In more general terms, it is proposed to determine a nuisance measure based on a plurality of (present and/or past) segments of the input audio signal 211. The nuisance measure A(n) (also referred to as an aberrance measure) may be indicative of an abnormal voice pattern within the plurality of segments of the input audio signal 211. The nuisance measure A(n) may be determined based on the output (e.g. the classifications C(n) and/or the probabilities P(n) of the plurality of segments of the input audio signal 211) provided by the VAD module 204 and/or based on the transmit decisions taken by the terminal 120, 170 when generating the upstream audio signal 123. The nuisance measure A(n) may be used to control one or more parameters of the leveling unit 200, e.g. the update rate and/or the time constant for updating the level estimate 215 and/or for updating the leveling gain 214.

Figure 3A:
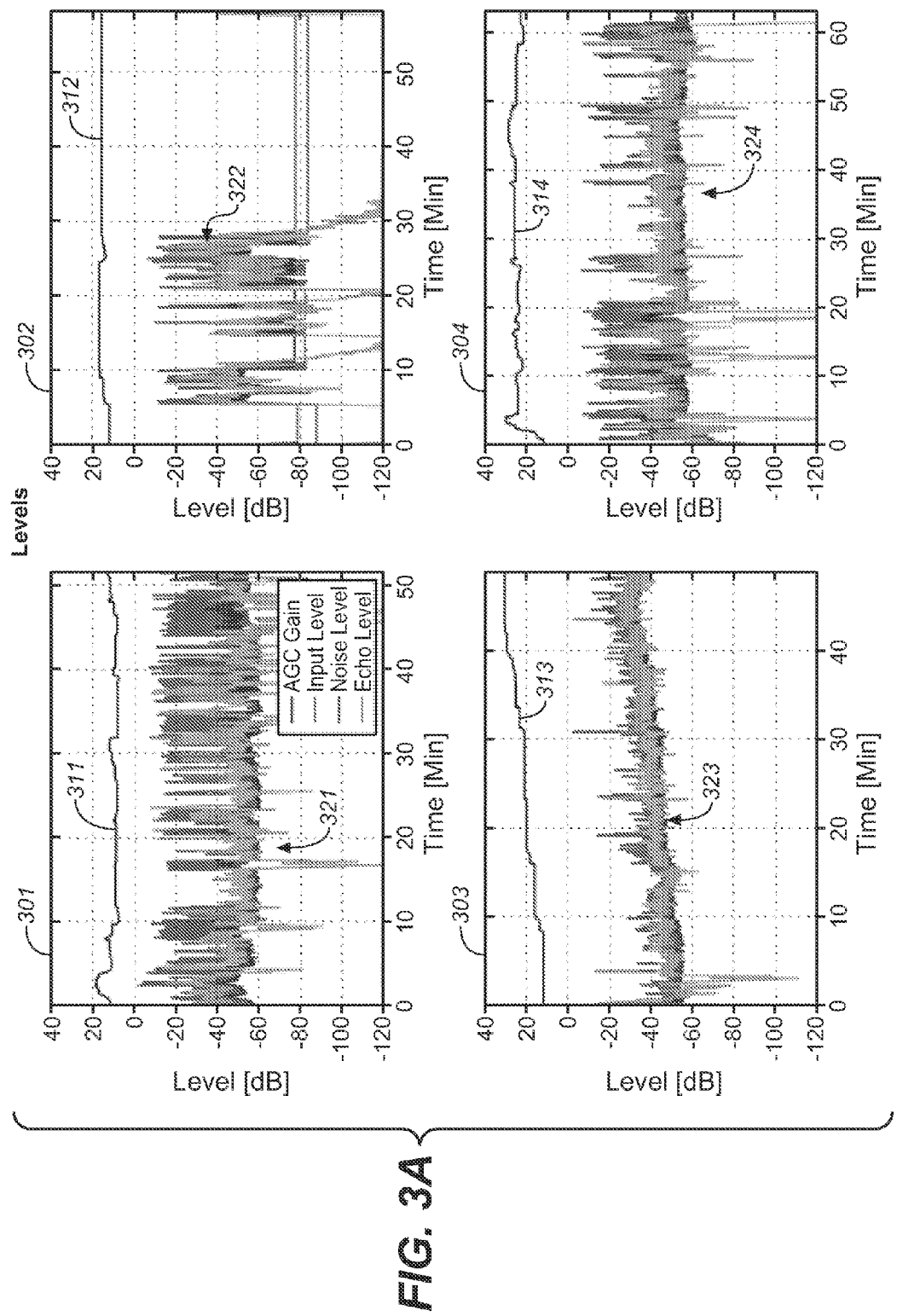
FIG. 3a shows leveling gains for a plurality of different example input audio signals.
Figure 3B:
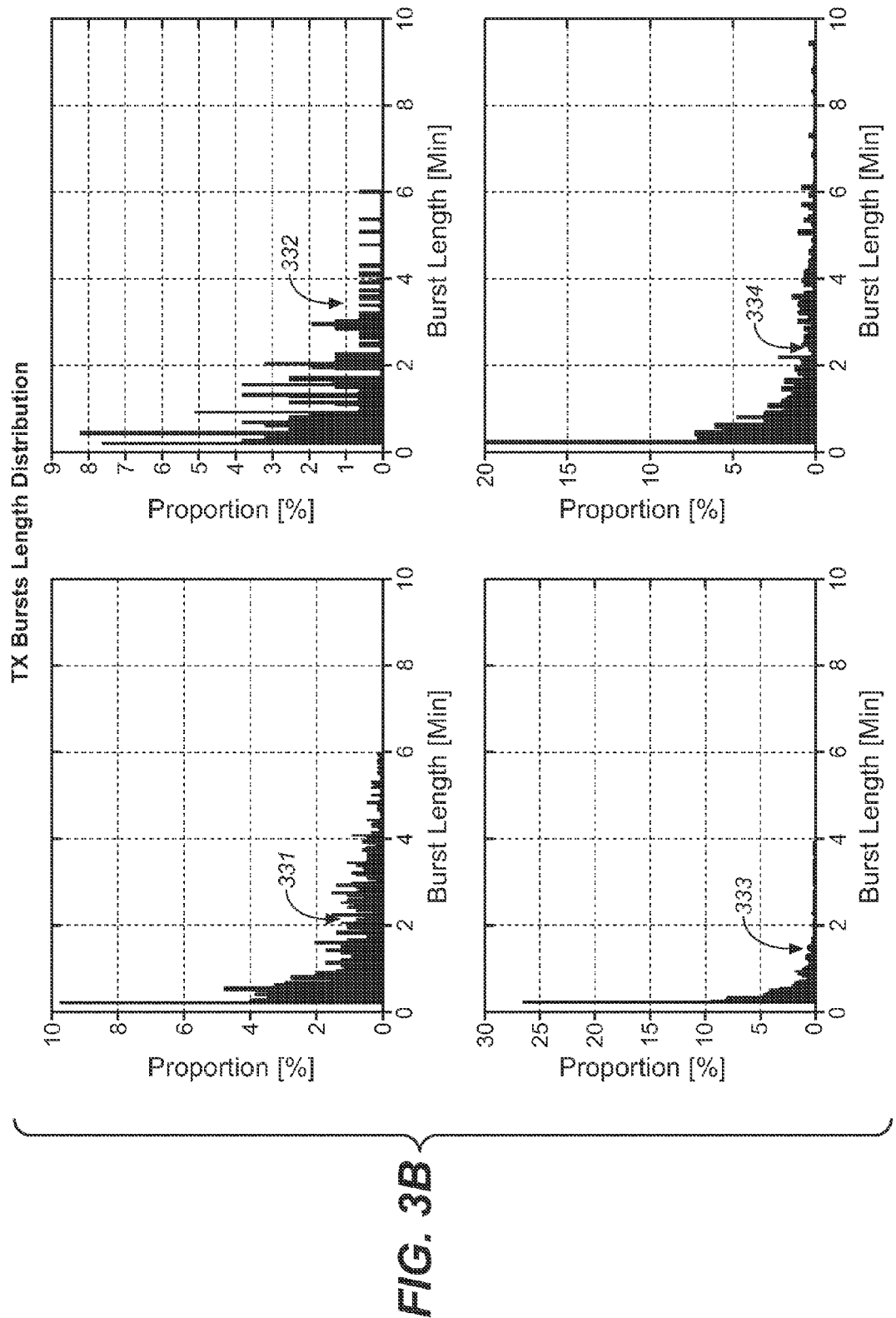

FIGS. 3a and 3b illustrate sample data from a multi-party conference, where one party is suffering from an automatic gain control (AGC) creep problem. FIG. 3a shows the levels or signal energy 321, 322, 323, 324 over time of the audio signals of four conference participants in the diagrams 301, 302, 303, 304, respectively. Furthermore, FIG. 3a shows the leveling gains 311, 312, 313, 314 over time which are determined by the leveling unit 200 for the four conference participants, respectively. It can be seen that the participant of diagram 303 is relatively inactive. Nevertheless, the gain 313 slowly increases. This results in a slowly increasing level of the noise comprised within the leveled audio signal of the participant of diagram 303. Furthermore, this may result in an increase of aberrant transmissions by the terminal 120, 170 of the participant of diagram 303, thereby increasing the bandwidth used within the audio communication system.

FIG. 3b shows the distribution 331, 332, 333, 334 of talk burst lengths for the same set of endpoints 120, 170 as in FIG. 3a. It can be seen that the participant with the AGC creep problem has a distribution 333 of talk burst lengths which differs significantly from the distributions 331, 332, 334 of the other participants. In particular, it can be observed that the distribution 333 is limited to short talk burst lengths. Talk bursts with short lengths may e.g. be due to the erroneous classification of background voice or noise to the "voice" class. At the same time, the absence of talk bursts with higher lengths indicates that the participant does not actively contribute to the multi-party conference.

As such, the distribution of the talk burst or activity lengths, in particular the presence of talk bursts with a duration which lies below a first duration threshold value, may be taken into account to determine the nuisance measure A(n). A shift of the distribution of the talk burst length (or talk burst duration) from a "normal" distribution 331, 332, 334 to an "abnormal" distribution 333, or vice versa, may be detected within an observation window (e.g. with a length of 5-20 ms). Such shift of the distribution may affect the nuisance measure, which may then be used to control the one or more parameters of the leveling unit 200.

It should be noted that short segments of speech may be common and acceptable in conversational activity. For example expletives, such as 'Yep' or 'ahah', may be short and repeated frequently as some-one is predominantly listening to a far-end participant. For this reason, it may be beneficial to include the presence of voice activity on the far-end (e.g. within the one or more downstream audio signals 124) for the determination of the nuisance measure. In particular, the presence of voice activity at the far-end may be used to indicate the likelihood of an aberrant local voice activity.

As such, it is proposed to use a measure of aberrance, which is referred to as nuisance measure, to control one or more parameters of the leveling unit 200 (e.g. to regulate the gain control used within the leveling unit 200). The measure of aberrance may be based on the transmit or VAD activities of the input audio signal 211. Where possible, the measure of aberrance is determined by taking into account information about the far-end audio signals, as a possible indicator of aberrance. The aberrance measure may be used to affect the behavior of the gain control within the leveling unit 200.

Figure 4:
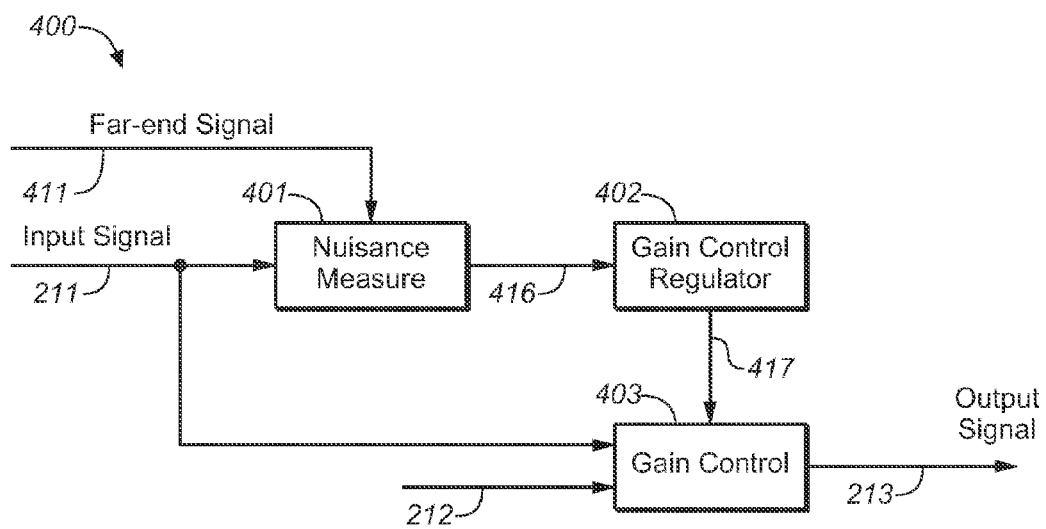
FIG. 4 shows a block diagram of an example leveling unit which is configured to determine and to use a nuisance measure.

FIG. 4 shows a block diagram of an example leveling unit 400 which is configured to determine and to apply a nuisance measure. The leveling unit 400 comprises a nuisance determination module 401 which is configured to determine a nuisance measure A(n) 416. The nuisance measure 416 may be determined based on the input audio signal 211 (also referred to as the near-end audio signal) and/or based on one or more far-end audio signals 411 (e.g. of one or more other participants of a multi-party conference).

Furthermore, the leveling unit 400 comprises a regulator module 402. The regulator to module 402 may be configured to determine one or more parameters 417 which affect the determination of the leveling gain 214, based on the nuisance measure 416. By way of example, the regulator module 402 may be configured to reduce or increase the time constant and/or the rate for updating the voice level estimate 215, based on the value of the nuisance measure 416. Alternatively or in addition, the regulator module 402 may be configured to reduce or increase the time constant and/or the rate for updating the leveling gain 214, based on the value of the nuisance measure 416.

In addition, the leveling unit 400 comprises a gain control module 403. The gain control module 403 may be configured to determine the leveling gain 214 using the one or more parameters 417 set by the regulator module 402. Furthermore, the gain control module 403 may be configured to determine the leveled output signal 213. As such, the gain control module 403 may comprise one or more (e.g. all of the) components of the leveling unit 200.

In the following, specific embodiments of the leveling unit 400 (and in particular of the regulator module 402) are described.

In an embodiment, the density of voice activity bursts is used to determine the nuisance measure A(n) 416. The nuisance measure A(n) 416 may be determined based on a set of parameters which keep track of the duration $d_b$ of the current burst, as provided by the VAD module 204, and/or of the duration $d_n$ of the time since the last burst. The nuisance measure A(n) may be initialized to a default value $A_0$, e.g. $A_0=0$. The nuisance measure A(n) may be incremented, if the duration $d_b$ of the current burst is smaller than a pre-determined first duration threshold value $S_1$. The first duration threshold value $S_1$ may be set such that the likelihood that background noise is mistaken as voice activity is reduced (e.g. minimized). In an embodiment, the first duration threshold value $S_1$ lies within the range of [0.2 s, 2.5 s], e.g. 1 s.

The increment amount $\Delta_1$ by which the nuisance measure A(n) is incremented may be used to control the speed of adaption of the one or more parameters 417 within the regulator module 402. By way of example, the parameters 417 may be set such that gain control module 403 interrupts the update of the leveling gain. The increment amount $\Delta_1$ may be used to control the time interval within which an aberrant pattern (e.g. a burst distribution 333) is detected within the input audio signal 211. In an embodiment, increment amount $\Delta_1$ lies within the range [0.05, 1.0], e.g. $\Delta_1=0.2$.

The nuisance measure A(n) may be incremented up to a maximum value $A_{max}$. Once the maximum value is reached a further increase may be prohibited, thereby limiting the nuisance measure to the maximum value $A_{max}$. A maximum value for the nuisance measure prevents the nuisance measure from growing unbounded and bounds the time required for the nuisance measure to indicate a "normal conversational situation", once a burst of sufficient duration has been detected. In an embodiment, the maximum value $A_{max}$ lies within the range [1.0, 3.0], e.g. $A_{max}=1.2$.

A decay factor $\alpha_A$ may be used to reduce the nuisance measure A, if it has been detected that the duration $d_b$ of a burst exceeds a pre-determined second duration threshold $S_2$. In an embodiment, where the system and calculations operated on a 20 ms frame rate, the decay factor $\alpha_A$ is set to 0.99 and/or the second duration threshold $S_2$ is set to 250 ms, with a range of 50-1000 ms found to be useful in some embodiments. Larger values may lead to an undesirable delay in the restoration of leveling in intended voice segments. The values for the decay factor $\alpha_A$ and/or of the second duration threshold $S_2$ may be selected from a wide range and depend on the desired reaction time of the nuisance measure to changes in the structure of the input audio signal 211.

Other embodiments of the nuisance measure A may incorporate sophisticated aberrant burst detection methods, including signal analysis.

In an embodiment, a 'timeout' feature is used to reduce the value of the nuisance measure A(n), if no bursts have been seen for a certain amount of time. In other words, the nuisance measure may be reduced, if the duration $d_n$ of the time since the last burst exceeds a timeout threshold value $S_t$. The duration $d_n$ may be determined using a parameter which keeps track of the time since the last burst activity. In an embodiment, the timeout threshold value $S_t$ is selected from a range of [15 s, 300 s], e.g. $S_t=60$ s. Once the timeout threshold value is passed, the nuisance measure may be ramped down using a timeout decay factor $\alpha_d$. In an embodiment having a frame or calculation update rate of 20 ms the timeout decay factor $\alpha_d$ is selected in the range of [0.9, 0.999], e.g. $\alpha_d=0.997$, depending on how quickly the nuisance measure should decrease. During the timeout phase, i.e. subsequent to the determination that the duration $d_n > S_t$, the nuisance measure may be updated on a segment by segment basis, e.g. $A(n)=\alpha_d*A(n-1)$.

In other embodiments, this decay may take place without any given timeout threshold value, in this way the nuisance level is constantly decaying and returning to a suitably low value in the absence of nuisance activity and over a duration ranging from 15 to 300 s. In an embodiment, a 'reset' feature is provided to enable the nuisance measure A to reset once a burst has satisfied one or more conditions. The one or more conditions may be related to the voice content of the current burst and/or the duration $d_b$ of the current burst exceeding a pre-determined third duration threshold value $S_3$. In an embodiment, the third duration threshold value $S_3$ is selected from a range [0.5 s, 4 s], e.g. $S_3=2$ s. The 'reset' feature allows the nuisance measure to quickly indicate a normal conversational situation, when near-end voice activity is detected.

As such, the nuisance measure A(n) 416 may be determined based on the duration $d_b$ of a current and/or the duration $d_b$ of previous bursts. Typically, the nuisance measure A(n) 416 is updated once the duration $d_b$ of the current burst has been determined. Prior to the determination of the duration $d_b$ of the current burst, a previously determined value for the nuisance measure A(n) 416 may be maintained (e.g. A(n)=A(n-1)).

The nuisance measure A(n) 416 may be applied by the regulator module 402 in a discrete manner. In other words, the regulator module 402 may consider one or more pre-determined nuisance threshold values $S_A$. By way of example, a nuisance measure $A(n)<S_A$ may indicate a "normal conversational situation", wherein a nuisance measure $A(n)>S_A$ may indicate an "aberrant situation". In an embodiment, the nuisance threshold value $S_A$ is selected from the range [0.4, 1.4], e.g. $S_A=0.9$. It should be noted that the value of the nuisance threshold value $S_A$ typically depends on the scaling of the nuisance measure A(n) 416. Since the levels of increment and absolute value of nuisance measure could be of arbitrary scale, it is suggested in relative terms that a sequence of around 3 to 10 nuisance events be sufficient to saturate the nuisance measure at its highest value. In one embodiment, a value of 5 was found to be useful.

The regulator module 402 may be configured to turn off the updating process of the leveling gain (wherein the updating process is performed within the gain control module 403), when the nuisance measure exceeds the nuisance threshold value, i.e. $A(n)>S_A$. This may be achieved e.g. by setting the time constant $\alpha_G=1$ (see recursive formula for the leveling gain G(n)). As such, the regulator module 402 may pass the appropriate time constant as a parameter 417 to the gain control unit 403, and the gain control unit 403 may perform leveling using the parameter 417.

Figure 5A:
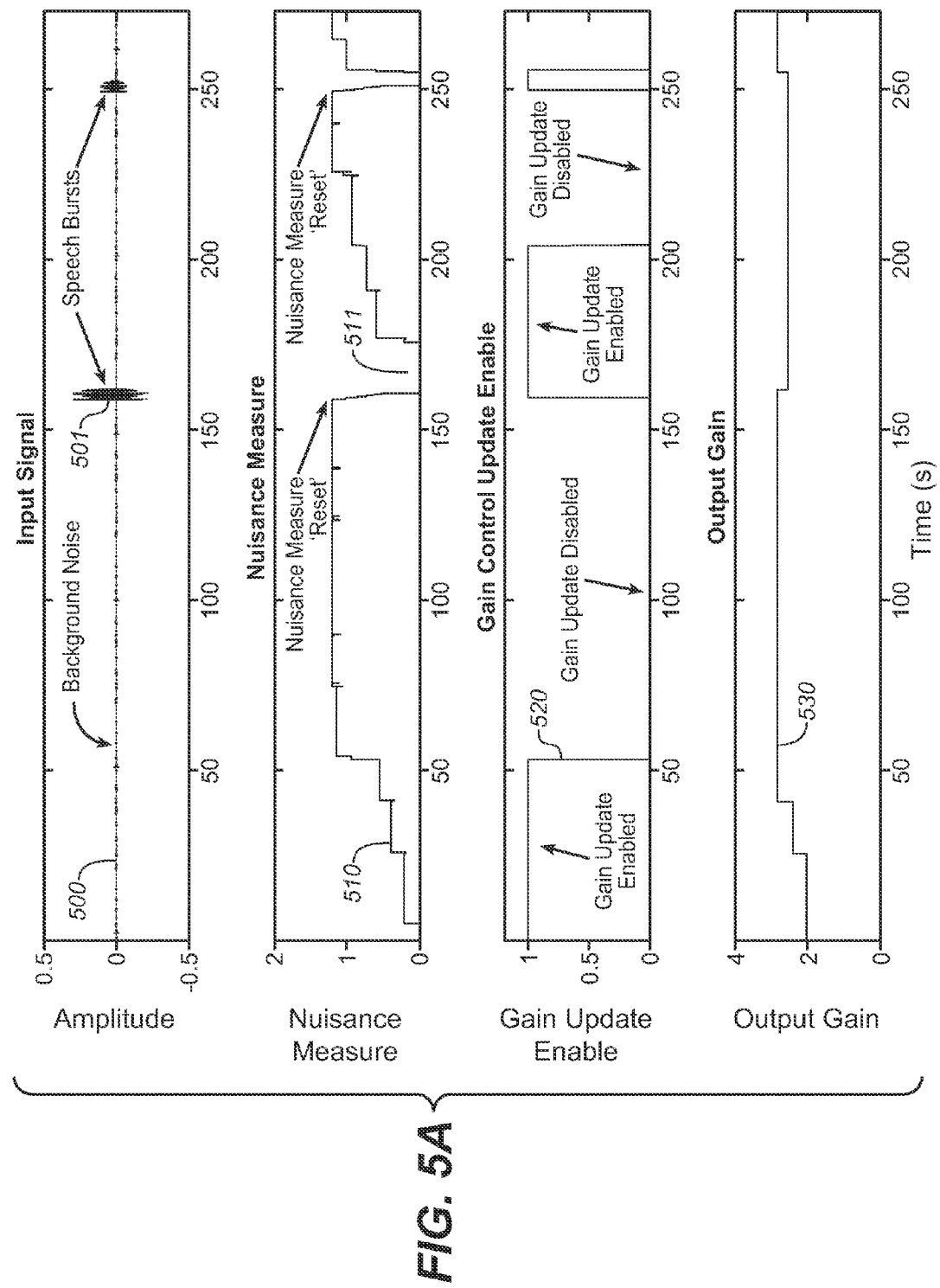
FIG. 5a illustrates an example nuisance measure for an example input audio signal.
Figure 5B:
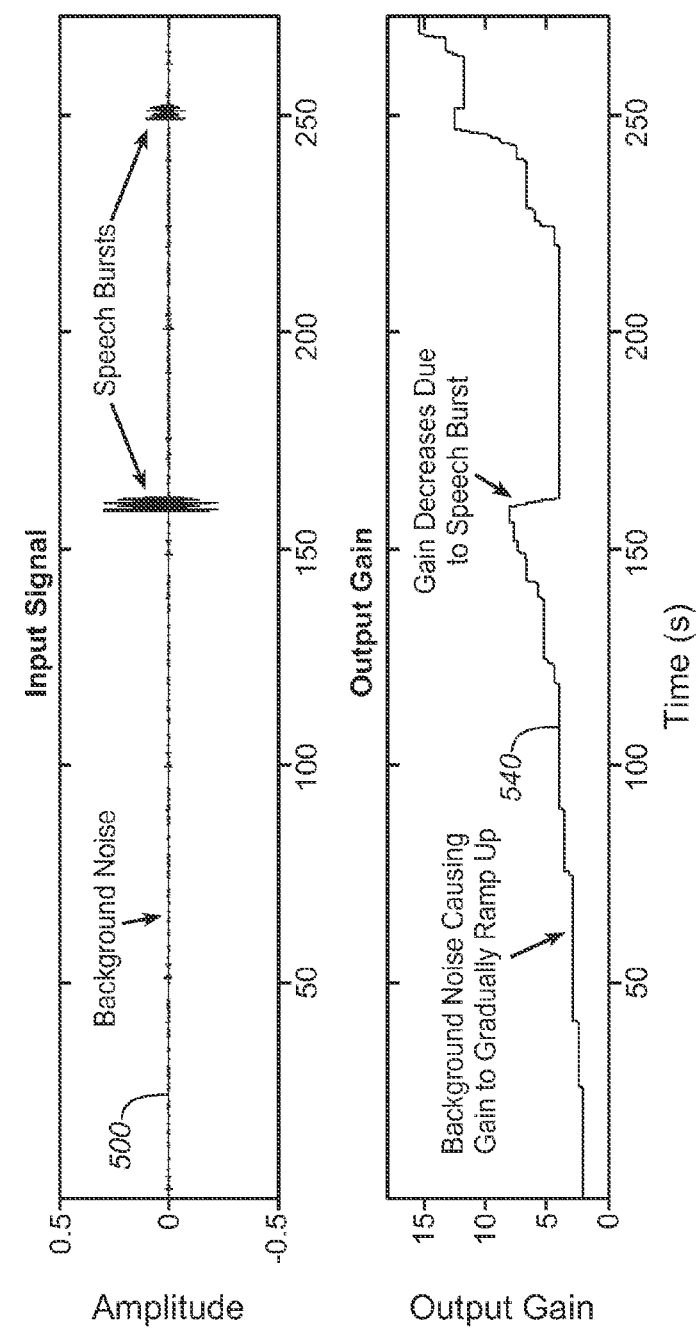
FIG. 5b illustrates a leveling gain for the example input audio signal of FIG. 5a, when not using the nuisance measure.

FIGS. 5a and 5b illustrate the performance of an example leveling unit 400 which is configured to determine a nuisance measure 416 and which is configured to control the determination of the leveling gain 214 based on the nuisance measure 416. FIG. 5a shows in the top diagram an example input audio signal 500, 211. The input audio signal 500 comprises background noise, as well as bursts 501 which are due to actual speech from the participant. Furthermore, FIG. 5a shows in the second from top diagram values 510 of an example nuisance measure 416. The values 510 have been determined based on the example input audio signal 500. It can be seen that due to the detection of short bursts, the nuisance measure 416 increases (e.g. up to a maximum value $A_{max}$). The nuisance determination unit 401 makes use of the reset feature, such that the determination of a burst 501 which has a duration $d_b$ which exceeds the third duration threshold value $S_3$, the nuisance measure 416 is reset to the default value $A_0$ (as can be seen at reference numeral 511).

The regulator module 402 uses the nuisance measure 416 in a discrete manner. In particular, the regulator module 402 enables the update of the leveling gain 214, if the nuisance measure 416 lies below the nuisance threshold value $S_A$, and disables the update of the leveling gain 214, if the nuisance measure 416 lies above the nuisance threshold value $S_A$. This is illustrated by the curve 520 of FIG. 4a. As a result, the update of the leveling gain 214 is disabled, if the nuisance measure 416 lies above the nuisance threshold value $S_A$, thereby preventing AGC creeping. This is illustrated by the leveling gain curve 530 of FIG. 5a. On the other hand, FIG. 5b shows the curve 540 of the leveling gain 214 without the use of the nuisance measure 416. It can be seen that the background noise comprised within the input audio signal 211, 500 leads to an increase of the leveling gain curve 540, i.e. leads to AGC creeping.

As indicated above, in some embodiments, a far-end signal 411 may be used as a further or as an alternative indicator of aberrance. In particular, if the far-end signal 411 exhibits voice activity, then this may be an indicator that short bursts on the near-end audio signal 211 are due to an aberrant situation (e.g. due to background noise).

In an embodiment, the far-end audio signal 411 is passed through an amplitude peak tracker, wherein the peak tracker is configured to determine the peak amplitudes of an audio signal for a sequence of segments of the audio signal. If the peak amplitudes are above a peak threshold value $S_p$ for at least a pre-determined peak duration threshold value $S_{pd}$, the far-end audio signal 411 may be deemed to be active. The peak threshold value $S_p$ may be selected from the range [−40 dB, −10 dB], e.g. $S_p$=−30 dB, and/or the peak duration threshold value $S_{pd}$ may be selected from the range [200 ms, 1.5 s], e.g. $S_{pd}$=400 ms. It should be noted that other embodiments may use further signal analysis of the far-end signal 411 to determine voice activity within the far-end audio signal 411. Alternatively or in addition, the VAD signal of the far-end signal 411 (i.e. the output of a VAD module 204 applied to the far-end audio signal 411) may be used to determine the presence of a voice activity within the far-end signal 411.

The nuisance determination module 401 may be configured to increase the nuisance measure A(n) by a pre-determined increment amount $\Delta_2$, if it is determined that the far-end audio signal 411 is active. The pre-determined increment amount $\Delta_2$ may be such that the nuisance measure A(n) exceeds the nuisance threshold value $S_A$. As such, an active far-end audio signal 411 may lead to a disabling of the upgrade of the leveling gain on the near-end audio signal 211.

In an embodiment, a burst of audio activity within the near-end audio signal 211, with a duration $d_b$ which exceeds a pre-determined fourth duration threshold value $S_4$ (which may be equal to the third duration threshold $S_3$), may be used to reduce or to reset the nuisance measure A(n), even while there is activity on the far-end audio signal 211. The fourth duration threshold value $S_4$ may be selected from the range [200 ms, 2 s], e.g. $S_4$=500 ms. The reduction of the nuisance measure A(n) may be such that the nuisance measure falls below the nuisance threshold value $S_A$. This allows the leveling unit 400 to detect and to take into account a situation where the near-end talker interrupts the far-end talker.

Figure 6:
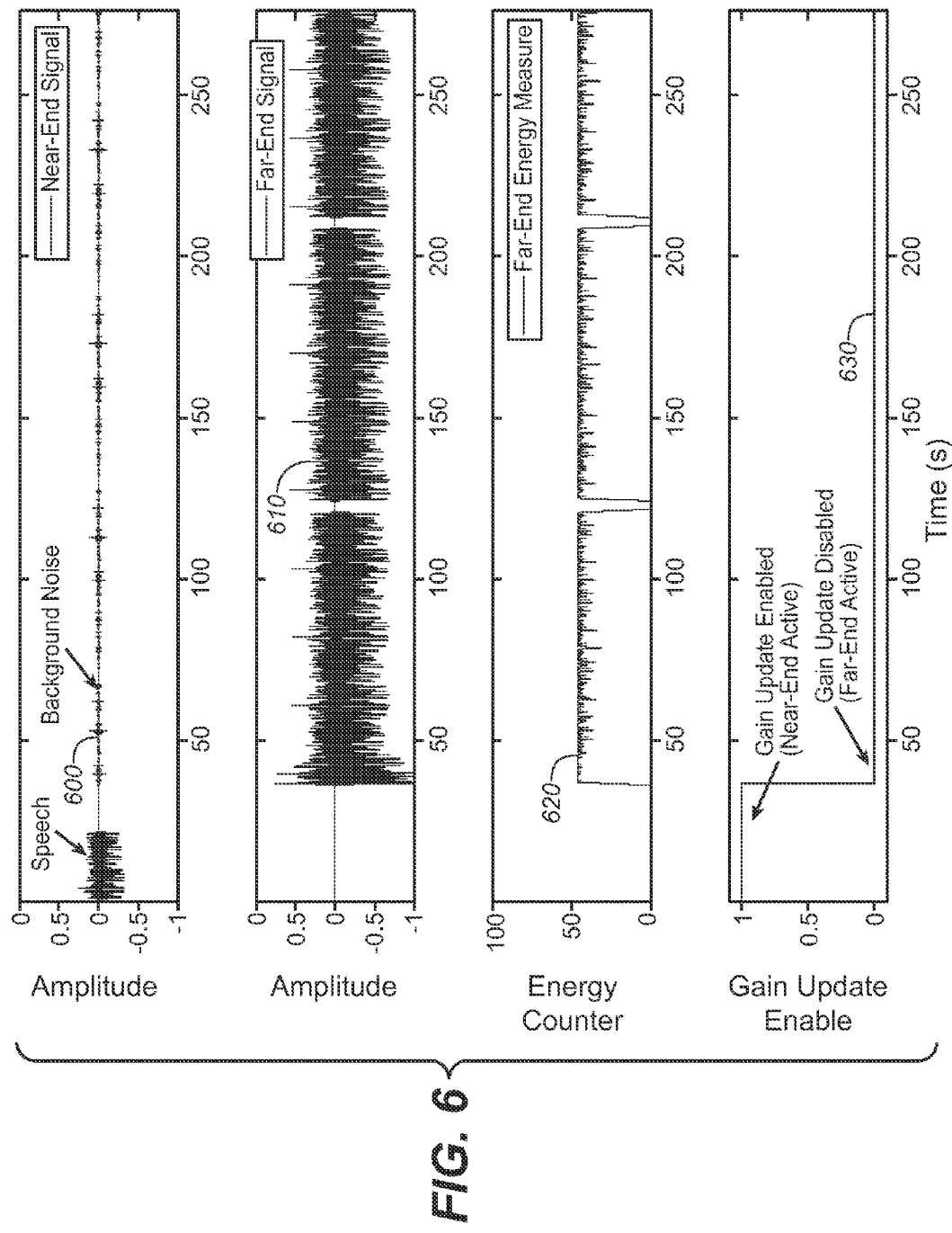
FIG. 6 illustrates the impact of an example nuisance measure which takes into account voice activity within a far-end audio signal.

FIG. 6 shows experimental results for a leveling unit 400 which takes into account the far-end audio signal 411 for leveling of the near-end audio signal 211. FIG. 6 shows an example near-end audio signal 211, 600 comprising an initial speech burst and a subsequent period with background noise. Furthermore, FIG. 6 shows an example far-end audio signal 411, 610 with several speech bursts. The nuisance determination module 401 makes use of an energy measure 620 for detecting voice activity within the far-end audio signal 411, 610. The nuisance determination module 401 is configured to increment the nuisance measure A(n) to a value above the nuisance threshold value $S_A$, as soon as voice activity is detected in the far-end audio signal 411, 610. Furthermore, the nuisance determination module 401 is configured to decrement the nuisance measure A(n) based on voice activity within the near-end audio signal 211, 600 as outlined above. In the illustrated case, the nuisance measure A(n) is below the nuisance threshold value $S_A$ prior to the first voice burst within the far-end audio signal 411, 610, and above the nuisance threshold value $S_A$ from thereon. As result, the regulator module 402 sets the parameters of the gain control module 403 such that the update of the leveling gain for the near-end audio signal 211, 600 is disabled starting with the first voice burst within the far-end audio signal 411, 610.

As outlined above, the nuisance measure A(n) may be used by the regulator module 402 in a discrete manner. It should be noted that, alternatively or in addition, the nuisance measure A(n) may be used by the regulator module 402 in a continuous manner. In the following, an example for such a case is described.

As outlined above, a nuisance measure A(n) may be determined based on a plurality of segments of the near-end audio signal 211 and/or of the far-end audio signal 411. The nuisance measure may be determined using one or more of the above mentioned rules. Alternatively or in addition, the nuisance measure may be determined using a classification approach as described e.g. in the patent application 61/619, 187 and patent applications claiming priority thereof, which are incorporated herewith by reference.

The nuisance measure A(n) may be scaled in various manners. The scaling of the nuisance measure A(n) affects the values selected e.g. for the increment/decrement amounts and/or for the nuisance threshold values. In the following, it is assumed that the nuisance measure A(n) is normalized to the range [0, 1].

The nuisance measure A(n) 416 may be used by the regulator module 402 to control a rate and/or a degree at which the estimate L(n) of the level of the near-end audio signal 211 and/or the leveling gain G(n) 214 is updated. In the following example, the nuisance A(n) is used to change the rate at which the voice model (e.g. at which the estimate L(n) of the level of the near-end audio signal 211) is updated. Since the voice model affects the automatic gain control (AGC), the nuisance measure effectively limits the leveling unit 400 from leveling to sounds that are deemed a nuisance (e.g. sounds which result from typing on a keyboard).

Figure 7:
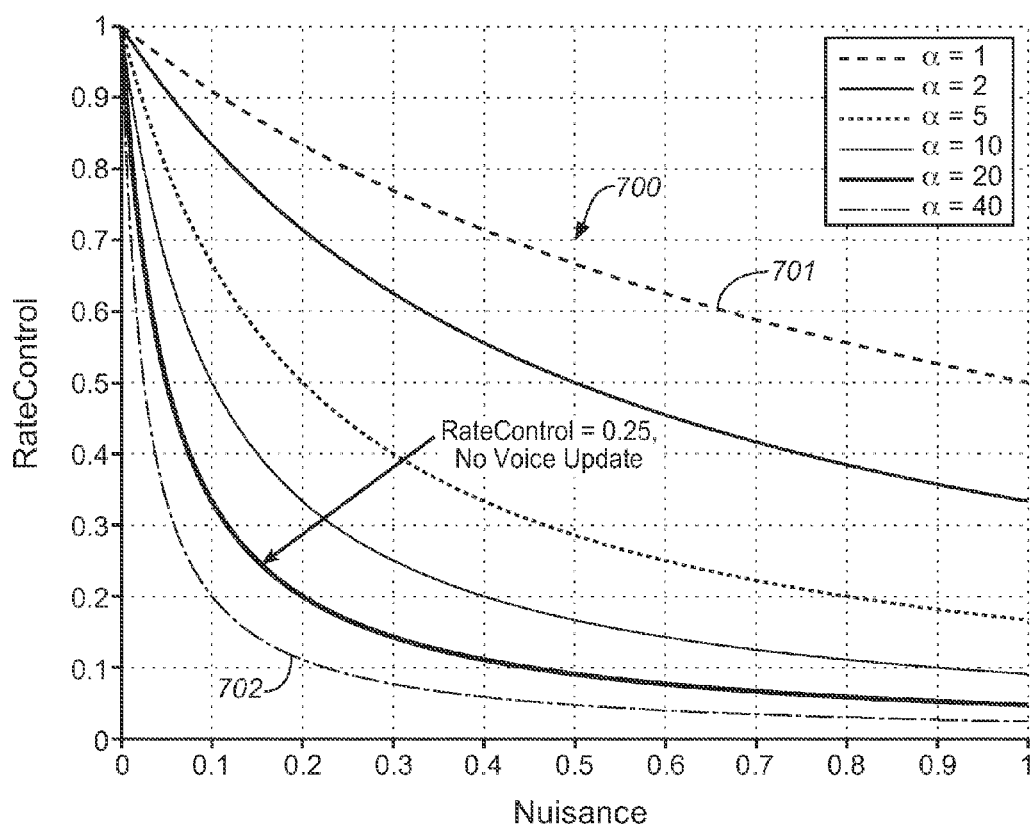
FIG. 7 shows an example RateControl parameter in dependence of an example nuisance measure.

The equation that governs the rate at which the voice model is updated may be given by:

$$RateControl(n) = \frac{1}{1 + \beta A(n)}$$

wherein A(n) denotes the nuisance measure, β controls the extent by which the nuisance measure can affect the Rate-Control parameter (e.g. β=20), and wherein the RateControl parameter takes on values in the range [0, 1]. FIG. 7 illustrates the relationship 700 between the RateControl parameter and the nuisance measure for various values of β (e.g. curve 701 for β=1 and curve 702 for β=40). As the nuisance measure increases, the RateControl parameter decreases.

The RateControl parameter may be used to slow down the rate at which the voice model is updated. In particular, the RateControl parameter may be used to weight one or more output parameters provided by the VAD module 204. Even more particularly, the RateControl parameter may be used to weight the probability P(n) that a current segment n of the input audio signal 211 comprises voice. As a result, a weighted probability $P_w(n)$ may be obtained as $P_w(n) = RateControl(n) \cdot P(n)$.

P(n) and $P_w(n)$ typically taken on values in the range [0, 1]. The leveling unit 200, 400 (in particular the level determination module 202) may be configured to update the voice model using the statistics of the current segment n of the input audio signal 211, in dependence on the value of the probability P(n). If the probability P(n) is above a probability threshold value $P_u$ (e.g. $P_u$=0.25), then the voice model may be updated; otherwise, the voice model may remain unchanged and the Automatic Gain Control (AGC) is unaffected. By way of example, the voice model may comprise the estimate L(n) of the voice level of the input audio signal 211. The level determination module 202 may be configured to update the level estimate L(n) based on the level or energy of the current segment n of the input audio signal 211, if P(n)>$P_u$ (see recursive formula above). Otherwise, the level estimate L(n) may remain unchanged.

The leveling unit 400 may be configured to use the weighted probability $P_w(n)$ (instead of the probability P(n)) for deciding to update or not the voice model. In particular, the level estimate L(n) may be updated if $P_w(n)$>$P_u$, otherwise the level estimate L(n) may remain unchanged. As such, the probability for a level update decreases as the nuisance measure increases.

Figure 8:
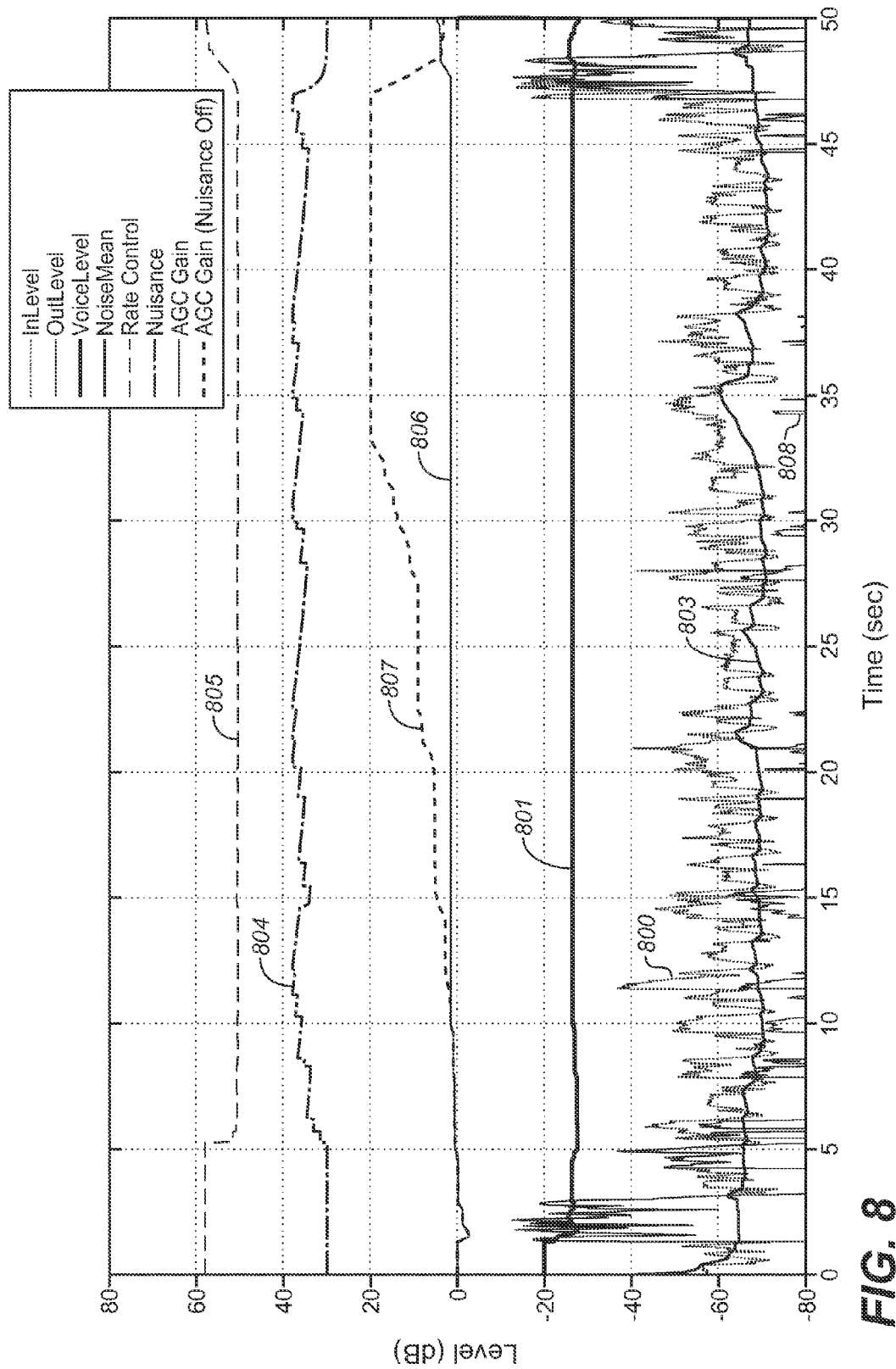
FIG. 8 shows example experimental results for audio leveling, when applying the RateControl parameter.

FIG. 8 illustrates the effect of the above mentioned scheme for creep control using an input audio signal 211, 800 comprising periods of voice, as well as background keyboard typing sounds. In particular, the input audio signals 211, 800 comprises aberrant background noise (conversation in the distance) in the segments from 5-45 sec., and desired speech between segments from 1-5 sec. and 45-50 sec. Furthermore, FIG. 8 shows the average noise level 803 comprised within the input audio signals 211, 800.

For a selected value of β=20, and for $P_u$=0.25, the update of the voice level is clamped whenever the nuisance measure A(n) exceeds 0.15 (as in such cases, the weighted probability $P_w(n)$ cannot exceed $P_u$). FIG. 8 shows a nuisance measure A(n) 804 for the input audio signal 211. The nuisance measure A(n) has been determined using the above mentioned rules. It can be seen that the nuisance measure A(n) increases at time instants when the input audio signal 211 comprises short bursts (which are primarily due to background noise), wherein the nuisance measure A(n) decreases at time instants when the input audio signal 211 comprises long bursts (which are due to actual speech). The nuisance measure A(n) affects the Rate Control parameter 805 and the weighted probability $P_w(n)$. By consequence the nuisance measure A(n) affects the (average) rate at which the level estimate L(n) is updated. FIG. 8 shows the voice level estimate L(n) 801 for the input audio signal 211, 800. Furthermore, FIG. 8 shows the corresponding leveling gain 806. It can be seen that the nuisance measure suppresses the level update during the period of the input audio signal 211, 800 which comprises background noise. By consequence the AGC gain 806 remains constant throughout the period of aberrant background noise.

FIG. 8 also illustrates a case where no nuisance measure A(n) is used. It can be seen that the leveling gain 807 is updated based on the background noise segments of the input audio signal 211, 800. In particular, it can be seen that the AGC gain 807 attempts to level the background noise causing the gain to rise until it reaches a maximum gain limit of +20 dB. At the time instant of 48 sec, the gain 807 drops again, due to the onset of desired voice within the input audio signal 2110, 800. Overall, it can be seen that in the absence of a nuisance measure, the AGC gain amplifies background noise, thereby increasing the noise within the audio communication system.

In the present document, methods and systems for performing an automatic gain control of an input audio signal have been described. In particular, the methods and systems address the problem of creep, by making the determination of the leveling gain for the input audio signal dependent on a nuisance measure which is indicative of the absence/presence of desired speech within the input audio signal. In particular, it is proposed to make a speed and/or and extent of update of the leveling gain dependent on the nuisance measure.

The methods and systems described in the present document may be implemented as software, firmware and/or hardware. Certain components may e.g. be implemented as software running on a digital signal processor or microprocessor. Other components may e.g. be implemented as hardware and or as application specific integrated circuits. The signals encountered in the described methods and systems may be stored on media such as random access memory or optical storage media. They may be transferred via networks, such as radio networks, satellite networks, wireless networks or wireline networks, e.g. the Internet. Typical devices making use of the methods and systems described in the present document are portable electronic devices or other consumer equipment which are used to store and/or render audio signals.

The invention claimed is:

1. A method for leveling an audio signal using a leveling gain, the method comprising:
   updating the leveling gain for a current segment of the audio signal based on a target level;
   wherein the audio signal comprises a sequence of segments that include the current segment;
   applying the leveling gain to the current segment of the audio signal; and
   repeating the updating and applying for the sequence of segments of the audio signal; wherein the updating of the leveling gain is suspended, subject to determining a pre-determined number of aberrant voice bursts within the audio signal.

2. The method of claim 1, further comprising:
   determining a nuisance measure which is indicative of an amount of aberrant voice activity within the sequence of segments of the audio signal;

increasing the nuisance measure upon detection of an aberrant voice burst within the audio signal; and suspending the updating of the leveling gain if the nuisance measure exceeds a pre-determined nuisance threshold value.

3. The method of claim 2, further comprising:

applying a decay factor to the nuisance measure; and re-enabling the updating of the leveling gain if the nuisance measure falls below the pre-determined nuisance threshold value; wherein the decay factor determines how quickly the updating of the leveling gain is re-enabled.

4. The method of claim 1, wherein the audio signal represents a near-end audio signal; wherein the sequence of segments comprises the current segment and one or more preceding segments; the method further comprising:

determining a nuisance measure which is indicative of an amount of aberrant voice activity within the sequence of segments of the near-end audio signal; and determining the leveling gain for the current segment of the near-end audio signal, at least based on the leveling gain for the one or more preceding segments of the near-end audio signal, and by taking into account an estimate of the level of the current segment of the near-end audio signal; wherein the variable degree is dependent on the nuisance measure according to a variable degree.

5. The method of claim 4, wherein the method further comprises classifying the sequence of segments into voice segments and non-voice segments using voice activity detection.

6. The method of claim 5, wherein determining the nuisance measure comprises determining a duration of a voice burst of the near-end audio signal, wherein a voice burst comprises one or more successive voice segments; and wherein the nuisance measure depends on the duration of the voice burst.

7. The method of claim 6, wherein determining the nuisance measure comprises:

if the duration of the voice burst is below a first duration threshold value, increasing the amount of aberrant voice activity indicated by the nuisance measure;

if the duration of the voice burst is above a second duration threshold value, decreasing the amount of aberrant voice activity indicated by the nuisance measure.

8. The method of claim 5, wherein determining the nuisance measure comprises determining a duration of successive non-voice segments; and wherein the nuisance measure depends on the duration of successive non-voice segments.

9. The method of claim 4, wherein the nuisance measure is determined at least based on a sequence of segments of a far-end audio signal; wherein the near-end audio signal is derived from an audio signal captured by a microphone of an endpoint of an audio communication system; and wherein the far-end audio signal is to be rendered by a speaker of the endpoint.

10. The method of claim 4, wherein determining the leveling gain comprises determining whether the nuisance measure exceeds a nuisance threshold; wherein determining the leveling gain comprises, if the nuisance measure exceeds the nuisance threshold, setting the variable degree such that the leveling gain for the current segment of the near-end audio signal is independent of the estimate of the level of the current segment of the near-end audio signal.

11. The method of claim 10, wherein determining the leveling gain comprises, if the nuisance measure exceeds the nuisance threshold, setting the leveling gain to be equal to the leveling gain for the segment of the near-end audio signal, which is directly preceding the current segment of the near-end audio signal.

12. The method of claim 4, wherein determining the leveling gain comprises:

determining a probability that the current segment of the near-end audio signal comprises voice using voice activity detection;

weighting the probability with a weighting factor, thereby yielding a weighted probability; wherein the weighting factor depends on the nuisance measure; wherein the weighting factor is such that the weighted probability is decreasing if the amount of aberrant voice activity indicated by the nuisance measure increases; and if the weighted probability exceeds a probability threshold value, determining the leveling gain for the current segment of the near-end audio signal by taking into account the estimate of the level of the current segment of the near-end audio signal.

13. The method of claim 12, wherein determining the leveling gain by taking into account the estimate of the level of the current segment of the near-end audio signal comprises:

determining a current estimate of the voice level of the near-end audio signal at least based on a previous estimate of the voice level of the near-end audio signal and based on the estimate of the level of the current segment of the near-end audio signal; and determining the leveling gain for the current segment of the near-end audio signal such that the current estimate of the voice level of the near-end audio signal corresponds to a target level.

14. The method of claim 12, wherein determining the leveling gain comprises, if the weighted probability does not exceed the probability threshold value, determine the leveling gain for the current segment of the near-end audio signal without taking into account the estimate of the level of the current segment of the near-end audio signal.

15. The method of claim 4, wherein determining the leveling gain for the current segment of the near-end audio signal comprises:

updating the leveling gain for the current segment also based on a target level; and suspending the updating, if the nuisance measure exceeds a nuisance threshold.

16. A computing device for leveling an audio signal using a leveling gain, the computing device comprising one or more computing processors configured to perform:

updating the leveling gain for a current segment of the audio signal based on a target level;

wherein the audio signal comprises a sequence of segments that include the current segment;

applying the leveling gain to the current segment of the audio signal; and repeating the updating and applying for the sequence of segments of the audio signal; wherein the updating of the leveling gain is suspended, subject to determining a pre-determined number of aberrant voice bursts within the audio signal.

17. The computing device of claim 16, wherein the one or more computing processors are further configured to perform:

determining a nuisance measure which is indicative of an amount of aberrant voice activity within the sequence of segments of the audio signal;

increasing the nuisance measure upon detection of an aberrant voice burst within the audio signal; and suspending the updating of the leveling gain if the nuisance measure exceeds a pre-determined nuisance threshold value.

18. The computing device of claim 16, wherein the one or more computing processors are further configured to perform:

applying a decay factor to the nuisance measure; and re-enabling the updating of the leveling gain if the nuisance measure falls below the pre-determined nuisance threshold value; wherein the decay factor determines how quickly the updating of the leveling gain is re-enabled.

19. The computing device of claim 16, wherein the audio signal represents a near-end audio signal; wherein the sequence of segments comprises the current segment and one or more preceding segments; wherein the one or more computing processors are further configured to perform:

determining a nuisance measure which is indicative of an amount of aberrant voice activity within the sequence of segments of the near-end audio signal; and determining the leveling gain for the current segment of the near-end audio signal, at least based on the leveling gain for the one or more preceding segments of the near-end audio signal, and by taking into account an estimate of the level of the current segment of the near-end audio signal; wherein the variable degree is dependent on the nuisance measure according to a variable degree.

20. One or more non-transitory computer-readable media storing a sequence of instructions for leveling an audio signal using a leveling gain, which sequence of instructions, when executed by one or more computing processors, causes the one or more computing processors to perform:

updating the leveling gain for a current segment of the audio signal based on a target level;

wherein the audio signal comprises a sequence of segments that include the current segment;

applying the leveling gain to the current segment of the audio signal; and repeating the updating and applying for the sequence of segments of the audio signal; wherein the updating of the leveling gain is suspended, subject to determining a pre-determined number of aberrant voice bursts within the audio signal.

21. The media of claim 20, wherein the sequence of instructions comprises further instructions which, when executed by the one or more computing processors, causes the one or more computing processors to further perform:

determining a nuisance measure which is indicative of an amount of aberrant voice activity within the sequence of segments of the audio signal;

increasing the nuisance measure upon detection of an aberrant voice burst within the audio signal; and suspending the updating of the leveling gain if the nuisance measure exceeds a pre-determined nuisance threshold value.

22. The media of claim 20, wherein the sequence of instructions comprises further instructions which, when executed by the one or more computing processors, causes the one or more computing processors to further perform:

applying a decay factor to the nuisance measure; and re-enabling the updating of the leveling gain if the nuisance measure falls below the pre-determined nuisance threshold value; wherein the decay factor determines how quickly the updating of the leveling gain is re-enabled.

23. The media of claim 20, wherein the audio signal represents a near-end audio signal; wherein the sequence of segments comprises the current segment and one or more preceding segments; wherein the sequence of instructions comprises further instructions which, when executed by the one or more computing processors, causes the one or more computing processors to further perform:

determining a nuisance measure which is indicative of an amount of aberrant voice activity within the sequence of segments of the near-end audio signal; and determining the leveling gain for the current segment of the near-end audio signal, at least based on the leveling gain for the one or more preceding segments of the near-end audio signal, and by taking into account an estimate of the level of the current segment of the near-end audio signal; wherein the variable degree is dependent on the nuisance measure according to a variable degree.

* * * * *